(12) United States Patent
Tashiro et al.

(10) Patent No.: US 9,204,066 B2
(45) Date of Patent: Dec. 1, 2015

(54) SOLID-STATE IMAGING DEVICE, METHOD FOR DRIVING SOLID-STATE IMAGING DEVICE, AND SOLID-STATE IMAGING SYSTEM USING CONNECTABLE REFERENCE SIGNAL OUTPUT PIXELS

(75) Inventors: Kazuaki Tashiro, Ebina (JP); Kazuo Yamazaki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 789 days.

(21) Appl. No.: 13/462,487

(22) Filed: May 2, 2012

(65) Prior Publication Data

US 2012/0286139 A1 Nov. 15, 2012

(30) Foreign Application Priority Data

May 12, 2011 (JP) ................. 2011-107392
Feb. 10, 2012 (JP) ................. 2012-026816

(51) Int. Cl.
| | | |
|---|---|---|
| H01L 27/00 | (2006.01) |
| H01J 40/14 | (2006.01) |
| H03K 17/78 | (2006.01) |
| H04N 5/365 | (2011.01) |
| H01L 27/146 | (2006.01) |
| H04N 5/341 | (2011.01) |
| H04N 5/378 | (2011.01) |

(52) U.S. Cl.
CPC ............ *H04N 5/3655* (2013.01); *H01L 27/146* (2013.01); *H04N 5/341* (2013.01); *H04N 5/378* (2013.01)

(58) Field of Classification Search
USPC ...... 250/208.1, 214 R, 214 SW, 214.1, 208.2; 348/272–283, 294–324; 257/290–294, 257/414, 431–466
See application file for complete search history.

(56) References Cited

U.S. PATENT DOCUMENTS

| | | | |
|---|---|---|---|
| 6,344,877 B1 | 2/2002 | Gowda | |
| 7,525,080 B2 | 4/2009 | Barna | |
| 7,969,487 B2 * | 6/2011 | Matsuda | ............ 348/243 |
| 2007/0152137 A1 | 7/2007 | Barna | |
| 2009/0244338 A1 * | 10/2009 | Kume | ............ 348/294 |

FOREIGN PATENT DOCUMENTS

| | | |
|---|---|---|
| CN | 1612590 A | 5/2005 |
| CN | 1976402 A | 6/2007 |
| CN | 101296330 A | 10/2008 |
| JP | 2008-271280 A | 11/2008 |

* cited by examiner

*Primary Examiner* — Pascal M Bui Pho
(74) *Attorney, Agent, or Firm* — Canon USA, Inc. IP Division

(57) ABSTRACT

A solid-state imaging device has a configuration for selecting from a plurality of reference pixels at least one reference pixel for outputting a reference signal.

11 Claims, 12 Drawing Sheets

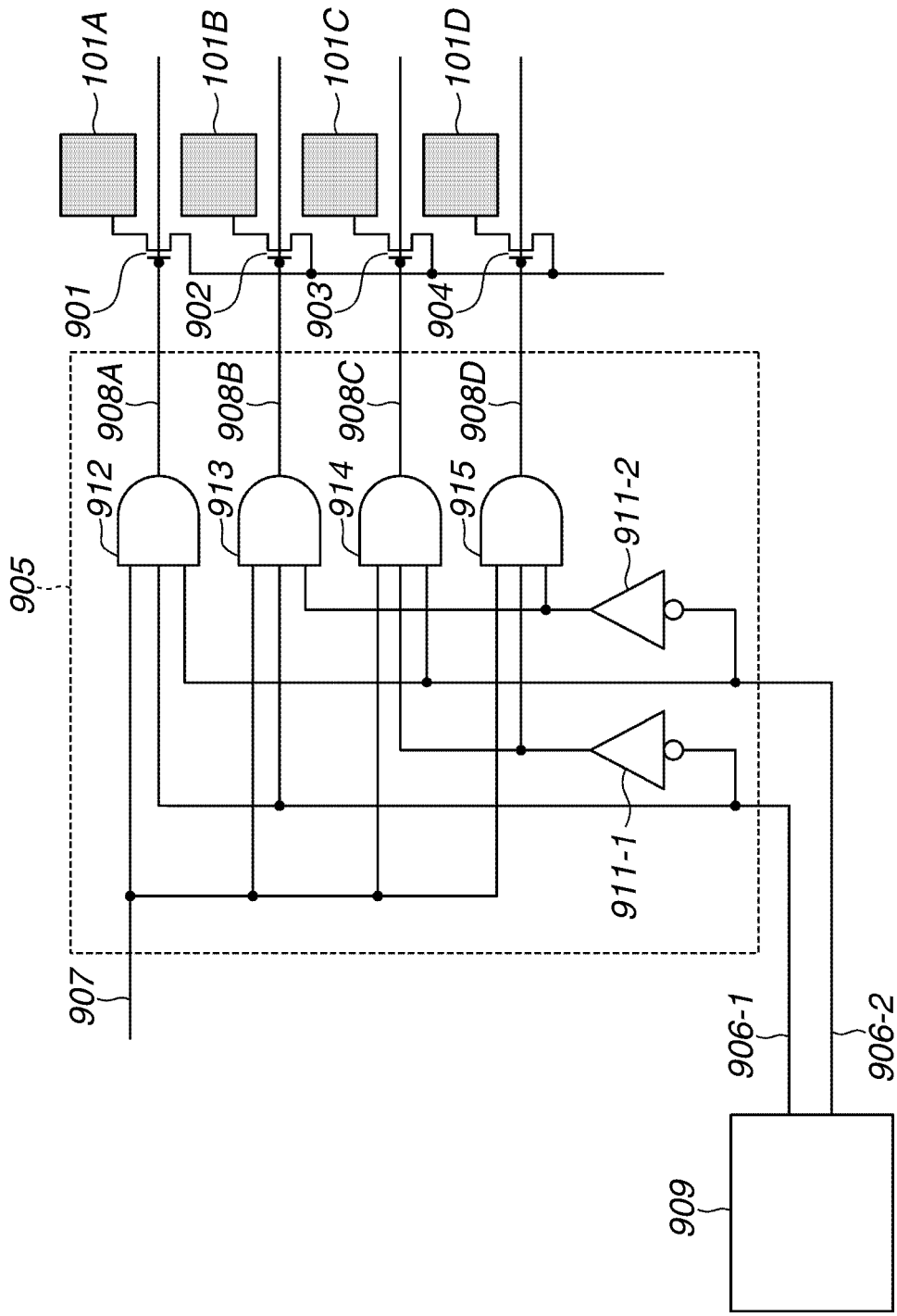

SOLID-STATE IMAGING DEVICE, METHOD FOR DRIVING SOLID-STATE IMAGING DEVICE, AND SOLID-STATE IMAGING SYSTEM USING CONNECTABLE REFERENCE SIGNAL OUTPUT PIXELS

TECHNICAL FIELD

One disclosed aspect of the embodiments relates to a solid-state imaging device having effective pixels and reference pixels, a method for driving the solid-state imaging device, and a solid-state imaging system having the solid-state imaging device.

BACKGROUND

A solid-state imaging device including effective pixels for outputting a signal based on photoelectric conversion, and reference pixels for outputting a reference signal without performing photoelectric conversion, is known. Such a solid-state imaging device obtains a difference between a signal output from effective pixels and a signal output from reference pixels to reduce noise in the output signal of the solid-state imaging device.

Although the pixel size in the solid-state imaging device is currently being miniaturized to improve resolution, the pixel size miniaturization reduces the area of a photoelectric conversion unit, degrading the sensitivity of the solid-state imaging device. Accordingly, with the solid-state imaging device, there has been a demand for simultaneously achieving high resolution and sensitivity degradation prevention by miniaturizing the pixel size while preventing the reduction in area of the photoelectric conversion unit.

Japanese Patent Application Laid-Open No. 2008-271280 discusses a solid-state imaging device including a plurality of effective pixels, reference pixels having equivalent characteristics to effective pixels except that photoelectric conversion is not performed, and differential pairs formed of effective and reference pixels, and correlated double sampling (hereinafter referred to as CDS) is performed.

An effective pixel includes a floating diffusion capacitance Cfd, which is connected to the gate of an amplification metal oxide semiconductor (MOS) transistor, for storing a charge output by the photoelectric conversion unit. A reference pixel is also provided with a floating diffusion capacitance Cfd connected to the gate of an amplification MOS transistor.

Each of the effective pixel and the reference pixel includes a capacitance Cio. One terminal of the capacitance Cio is connected to the output portion of a differential pair, and the other terminal thereof is connected to the gate of the amplification MOS transistor. With the configuration discussed in Japanese Patent Application Laid-Open No. 2008-271280, the capacitance value of the capacitance Cio is much smaller than the capacitance value of the floating diffusion capacitance Cfd. Hereinbelow, the capacitance Cio is referred to as micro capacitance Cio.

The solid-state imaging device including differential pairs formed of effective and reference pixels discussed in Japanese Patent Application Laid-Open No. 2008-271280 is capable of preventing both reset noise and fixed pattern noise contained in signals output from effective and reference pixels.

Japanese Patent Application Laid-Open No. 2008-271280 discusses a circuit configuration with which differential pairs are formed of effective and reference pixels, and amplification MOS transistors included in effective and reference pixels operate as MOS transistors of input stages of differential pairs. With the conventional configuration, there has been a problem that a defective reference pixel degrades the accuracy of a reference signal, resulting in degraded accuracy of signals output from a relevant differential pair.

SUMMARY

According to an aspect of the embodiments, a solid-state imaging device includes: a photoelectric conversion signal output pixel configured to output a photoelectric conversion signal based on a charge produced through photoelectric conversion of incident light; a plurality of reference signal output pixels configured to output a reference signal not based on incident light; a differential signal output unit configured to obtain a difference between the photoelectric conversion signal and the reference signal, and output a relevant differential signal; and a reference selection unit configured to select from the reference signal output pixels at least one reference signal output pixel for outputting a reference signal to the differential signal output unit.

According to another aspect of the embodiments, a method for driving a solid-state imaging device including a photoelectric conversion signal output pixel configured to output a photoelectric conversion signal based on a charge produced through photoelectric conversion of incident light, a plurality of reference signal output pixels configured to output a reference signal not based on incident light, and a differential signal output unit configured to obtain a difference between the photoelectric conversion signal and the reference signal, and output a relevant differential signal, the method includes selecting from the reference signal output pixels at least one of the reference signal output pixels for outputting a reference signal to the differential signal output unit.

With a solid-state imaging device according to the embodiments, a plurality of reference pixels capable of outputting a reference signal is provided for each differential amplifier circuit for obtaining a difference between a signal output by effective pixels and a reference signal output by reference pixels. This configuration enables preventing the degradation in signal accuracy due to defective reference signals.

Further features and aspects of the embodiments will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the disclosure and, together with the description, serve to explain the principles of the disclosure.

FIG. 3 is an equivalent circuit diagram illustrating in detail a reference selection unit of the solid-state imaging device according to an exemplary embodiment.

DESCRIPTION OF THE EMBODIMENTS

Various exemplary embodiments, features, and aspects of the disclosure will be described in detail below with reference to the drawings.

A solid-state imaging device according to an exemplary embodiment will be described below. Then, operations of the solid-state imaging device according to the present exemplary embodiment will be described below. In the following descriptions, a pixel is formed of N-channel transistors. When a pixel is formed of P-channel transistors, the embodiment is applicable by inverting the voltage polarity with respect to a case where a pixel is formed of N-channel transistors.

Figure 1:
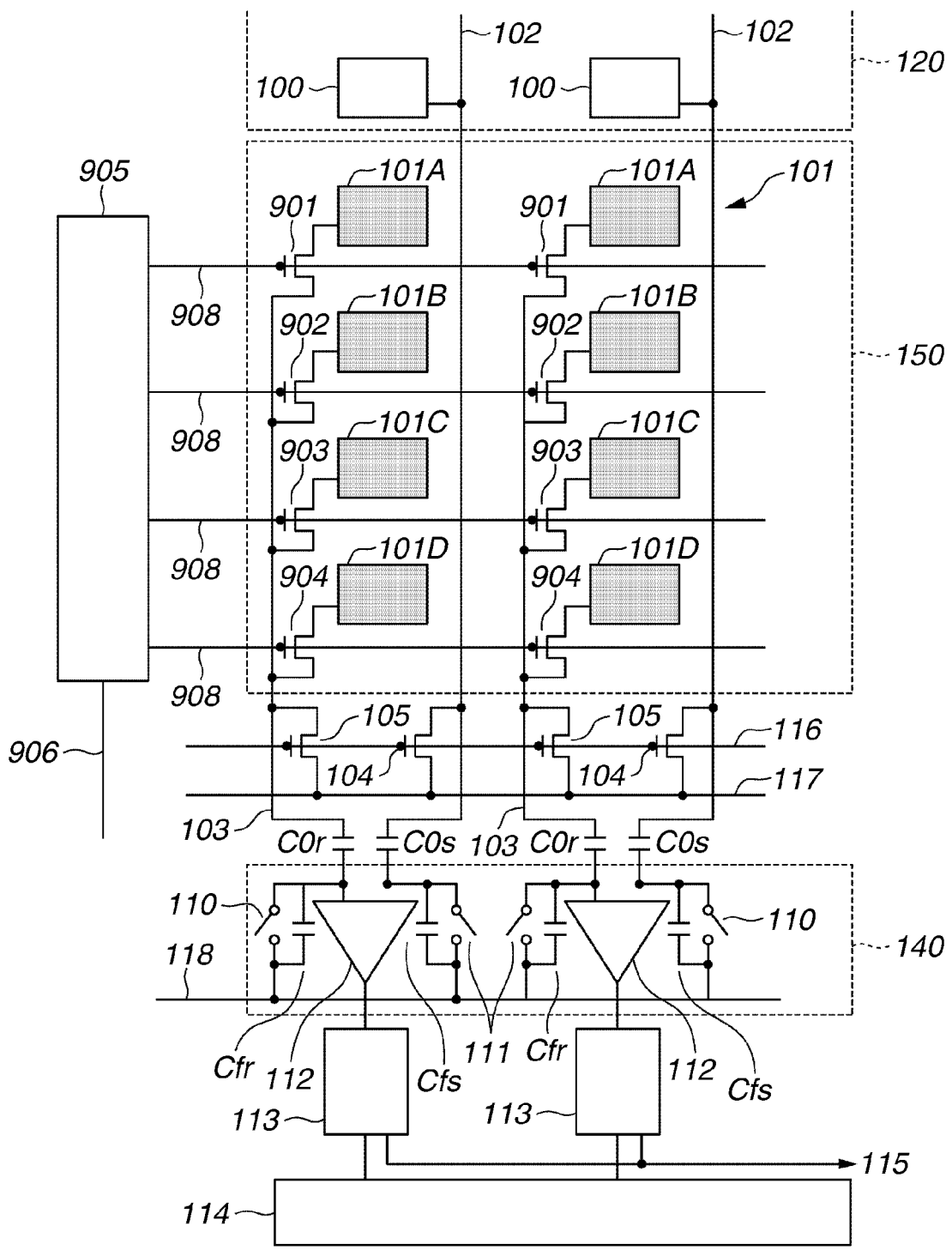
FIG. 1 is a block diagram illustrating a solid-state imaging device according to an exemplary embodiment.

FIG. 1 is a block diagram illustrating a solid-state imaging device according to the present exemplary embodiment. Effective pixels 100 output a signal based on incident light by performing photoelectric conversion. Reference pixels 101 output a signal without performing photoelectric conversion.

In the present exemplary embodiment, the effective pixels 100 are referred to as photoelectric conversion signal output pixels, and the reference pixels 101 are referred to as reference signal output pixels. A plurality of effective pixels 100 is arranged in matrix form, i.e., in a plurality of rows and a plurality of columns.

A plurality of reference pixels 101 is arranged in each pixel column in which a plurality of effective pixels 100 is arranged. A pixel region is formed of effective pixels 100 and reference pixels 101 arranged in a plurality of rows and a plurality of columns.

Hereinbelow, a region where the effective pixels 100 and the reference pixels 101 are arranged is referred to as a pixel region, a region where only the effective pixels 100 are arranged is referred to as a photoelectric conversion signal output pixel region 120, and a region where only the reference pixels 101 are arranged is referred to as a reference signal output pixel region 150.

The reference pixels 101 in a column are arranged closer to a differential amplifier 112 (described below) than all of the effective pixels 100 belonging to the same column. In other words, the reference pixels 101 are arranged at an end of the pixel region (where the effective pixels 100 and the reference pixels 101 are arranged) on the side of the differential amplifiers 112.

This means that an end of the reference pixels 101 on the side of the differential amplifiers 112 is closer to the differential amplifiers 112 than an end of the effective pixels 100 on the side of the differential amplifiers 112.

The effective pixels 100 arranged in the direction along the column are electrically connected to a first vertical signal line 102. The reference pixels 101 are electrically connected to a second vertical signal line 103. Hereinbelow, the signal from the reference pixels 101 transmitted by the second vertical signal line 103 is referred to as a reference signal.

The drains of load MOS transistors 104 and 105 are electrically connected to the first vertical signal line 102 and the second vertical signal line 103, respectively. The load MOS transistors 104 and 105 serve as a current source for sending a current to the first vertical signal line 102 and the second vertical signal line 103, respectively.

The load MOS transistor 104 is a first transistor, and the load MOS transistor 105 is a second transistor. With the load MOS transistors 104 and 105, a common gate wire 116 is electrically connected to the gate (control electrode), and a grounding (GND) wire 117 is electrically connected to the source.

The common gate wire 116 is a control signal line for applying to the gates of the load MOS transistors 104 and 105 a control signal for determining the current value to be supplied to the first vertical signal line 102 and the second vertical signal line 103, respectively.

The solid-state imaging device includes capacitances C0s, C0r, Cfs, and Cfr and switches 110 and 111. The differential amplifier 112, an example differential signal output unit 140, applies differential amplification to the signal from the effective pixel 100 transmitted through the first vertical signal line 102, and the reference signal transmitted from the reference pixels 101 through the second vertical signal line 103.

It is desirable that the capacitances C0s and C0r have the same capacitance value to equalize the amplification factor of the signal from the effective pixel 100 to that of a reference signal from the reference pixels 101. It is also desirable that the capacitances Cfs and Cfr have the same capacitance value. The capacitances C0s and C0r perform first CDS (described below). The first CDS is performed to equalize the amplification factor of the signal from the effective pixel 100 and the reference signal from the reference pixels 101.

The gain of the differential amplifier 112 is determined by the capacitance ratios C0s/Cfs and C0r/Cfr. Although not illustrated, forming each of the capacitances Cfs and Cfr by using a plurality of capacitances each having a variable capacitance value enables changing the gain of the differential amplifier 112.

When the capacitance values of the capacitances Cfs and Cfr are larger than those of the capacitances C0s and C0r, respectively, the gain of the differential amplifier 112 becomes low. On the contrary, when the capacitance values of the capacitances Cfs and Cfr are smaller than those of the capacitances C0s and C0r, respectively, the gain of the differential amplifier 112 becomes high.

A reference voltage line 118 supplies a reference voltage Vref to the differential amplifier 112. The differential amplifier 112, the capacitances C0s, C0r, Cfs, and Cfr, and the switches 110 and 111 form a differential circuit based on switched capacitances.

The signal from the effective pixels 100 is input to the inverting input terminal (−) of the differential amplifier 112, and the reference signal is input to the non-inverting input terminal (+) thereof. A signal processing circuit 113 is electrically connected to the differential amplifier 112.

The solid-state imaging device includes a plurality of effective pixels 100, reference pixels 101, first vertical signal lines 102, second vertical signal lines 103, and differential amplifiers 112, arranged in columns. A horizontal shift register (hereinafter referred to as HSR) 114 is electrically connected to a plurality of signal processing circuits 113 arranged in columns.

The HSR 114 selects from the signal processing circuits 113 arranged in columns one signal processing circuit 113 for outputting a signal. When the signal processing circuit 113 selected by the HSR 114 outputs a signal, the signal serves as a signal 115 output by the solid-state imaging device.

Reference signal selection switches 901 to 904 establish electrical connection and disconnection of the reference pixels 101 to/from the second vertical signal line 103. The gates of the reference signal selection switches 901 to 904 are electrically connected with a reference selection unit 905 via reference selection lines 908A to 908D, respectively.

The reference selection unit 905 controls the reference signal selection switches 901, 902, 903, and 904. Reference pixel selection information is transmitted from a storage circuit 909 to the reference selection unit 905 via the control line 906.

Based on the reference pixel selection information, the reference selection unit 905 selects at least one reference pixel 101 to be electrically connected to the second vertical signal line 103, out of the four reference pixels 101A to 101D arranged in each pixel column including the effective pixel 100.

Figure 2:
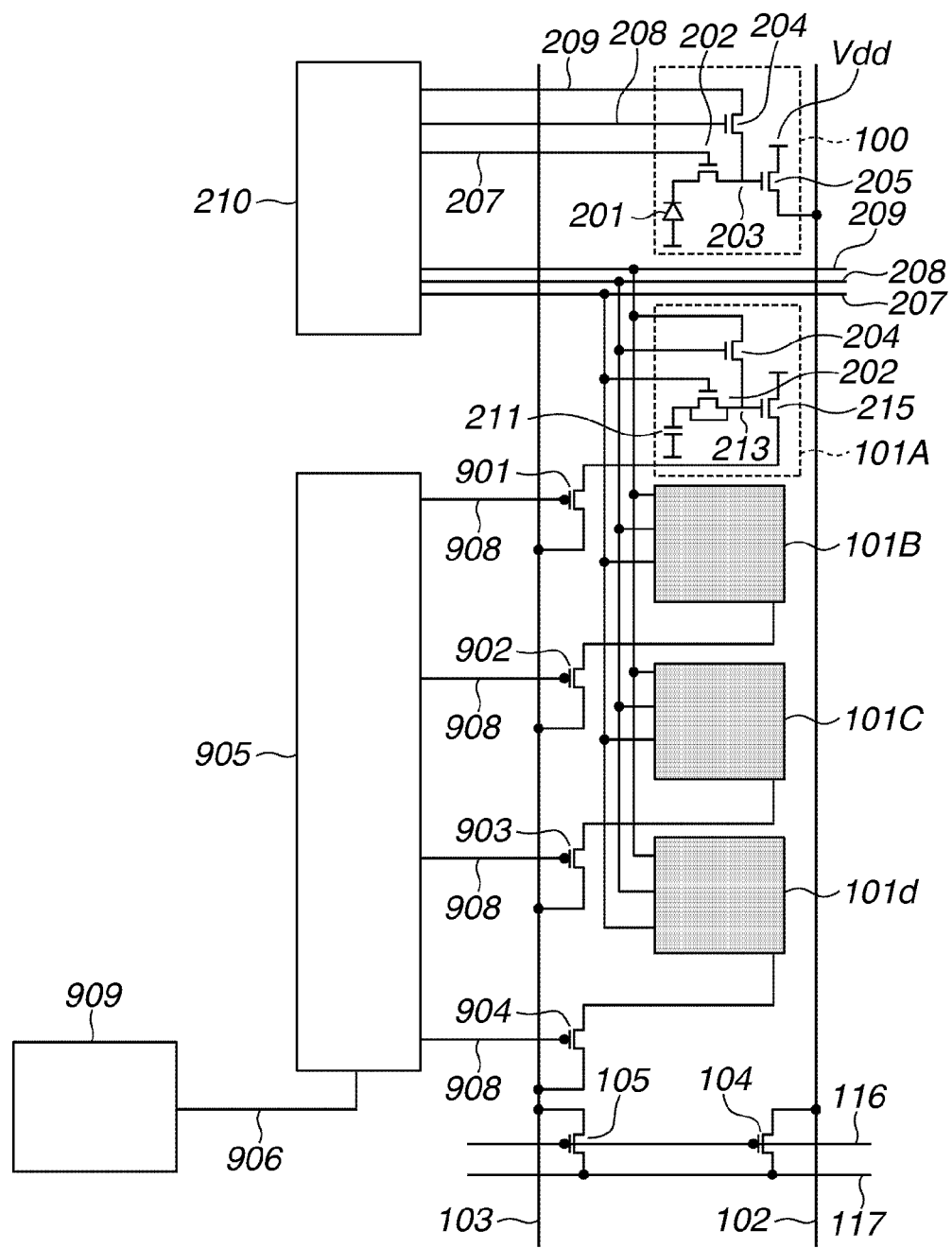
FIG. 2 is an equivalent circuit diagram illustrating in detail pixels of the solid-state imaging device according to an exemplary embodiment.

FIG. 2 illustrates an example effective pixel 100 and an example reference pixel 101. A photo diode 201 is a photoelectric conversion unit which converts incident light into a charge through photoelectric conversion. With a transfer MOS transistor 202, the source is electrically connected to the photo diode 201, the gate is electrically connected to a transfer control line 207, and the drain is electrically connected to a floating diffusion region (hereinafter referred to as FD region) 203.

The FD region 203 stores a charge transmitted from the photo diode 201 via the transfer MOS transistor 202. When forming a solid-state imaging device on a semiconductor substrate, the FD region is formed, for example, as an impurity diffusion region. With a reset MOS transistor 204, the source is electrically connected to the FD region 203, the gate is electrically connected to a reset control line 208, and the drain is electrically connected to a reset supply line 209.

With an amplification MOS transistor 205, the gate (control electrode) is electrically connected to the FD region 203, the drain is electrically connected to a voltage source Vdd, and the source is electrically connected to the first vertical signal line 102. The amplification MOS transistor 205 is referred to as a first amplification transistor. An amplification MOS transistor 215 (described below) included in the reference pixel 101 is referred to as a second amplification transistor.

The amplification MOS transistor 205 outputs to the first vertical signal line 102 a signal based on a voltage applied to the gate (control electrode), i.e., a signal based on the charge stored in the FD region 203. The reset control line 208, the reset supply line 209, and the transfer control line 207 are electrically connected to the vertical scanning circuit 210.

The reference pixel 101 includes a capacitance 211 instead of the photo diode 201. The reference pixel 101 may be configured with the same equivalent circuit as the effective pixel 100 except that the capacitance 211 is provided instead of the photo diode 201.

The source of the amplification MOS transistor 215 of the reference pixel 101 is electrically connected to the second vertical signal line 103. The transfer MOS transistor 202 of the reference pixel 101 may have the same configuration as the transfer MOS transistor 202 of the effective pixel 100. As illustrated in FIG. 2, the source and drain of the transfer MOS transistor 202 of the reference pixel 101 may be short-circuited.

This configuration enables setting the FD region 213 and the capacitance 211 to the same potential even without turning ON the transfer MOS transistor 202 by achieving electrical conduction between its source and drain. Thus, the effect of noise caused by ON/OFF switching of the transfer MOS transistor 202 may be reduced.

Similarly, with the reference pixel 101, the FD region 213 may be connected with the capacitance 211 without providing the transfer MOS transistor 202. The following descriptions are given on the premise that the source and drain of the transfer MOS transistor 202 of the reference pixel 101 are short-circuited as illustrated in FIG. 2.

The transfer control lines 207, the reset control lines 208, and the reset supply lines 209 of the effective pixel 100 and the reference pixel 101 are electrically connected to the vertical scanning circuit 210.

Next, the reference selection unit 905 will be described. FIG. 3 illustrates an example configuration of the reference selection unit 905. The reference selection unit 905 includes AND circuits 912 to 915 and inverters 911-1 and 911-2 to form a 2-bit demultiplexer. The reference selection unit 905 further includes two control lines 906 (906-1 and 906-2) to transmit a 2-bit selection signal.

The storage circuit 909 stores the reference pixel selection information. The 2-bit selection signal output from the storage circuit 909 is input to the AND circuits 912 to 915 via the control lines 906-1 and 906-2.

On the control line 906-1, the inverter 911-1 is provided between the storage circuit 909 and the AND circuit 914. Therefore, for example, when the storage circuit 909 outputs an H-level signal to the control line 906-1, an H-level signal is applied to the AND circuits 912 and 913, and an L-level signal is applied to the AND circuits 914 and 915.

Similarly, for example, when the storage circuit 909 outputs an H-level signal to the control line 906-2, an H-level signal is applied to the AND circuits 912 and 914, and an L-level signal is applied to the AND circuits 913 and 915.

Therefore, when the storage circuit 909 outputs an H-level signal to both the control lines 906-1 and 906-2, an H-level signal is applied to all input lines of only the AND circuit 912. Thus, the AND circuit 912 outputs an H-level signal to the reference signal selection switch 901 via the reference selection line 908A. Accordingly, the reference pixel 101A is electrically connected to the second vertical signal line 103.

To electrically connect other reference pixels 101B to 101D to the second vertical signal line 103, the 2-bit selection signal output from the storage circuit 909 to the control lines 906-1 and 906-2 may be controlled. Specifically, to select the reference pixel 101B, it is necessary to set the control line 906-1 to the H level and the control line 906-2 to the L level.

Similarly, to select the reference pixel 101C, it is necessary to set the control line 906-1 to the L level and the control line 906-2 to the H level. Further, to select the reference pixel 101D, it is necessary to set both the control lines 906-1 and 906-2 to the L level.

Thus, in the reference selection unit 905, any one of the reference signal selection switches 901, 902, 903, and 904 is electrically connected to the second vertical signal line 103 via the reference selection line 908A, 908B, 908C, and 908D, respectively. Therefore, even if any one of reference pixels 101A to 101D is defective, selecting any one of normal reference pixels 101 enables acquiring a normal reference signal.

A method for acquiring reference pixel selection information and then selecting a reference pixel 101 will be described below.

First of all, in the method, all of the reference pixels 101A to 101D of the solid-state imaging device is checked to detect addresses of defective reference pixels 101A to 101D. Then, based on defect levels, the reference pixels 101A to 101D are classified into different ranks to generate a reference pixel defect map.

Based on the generated reference pixel defect map, an optimum reference pixel row (a reference pixel row having the least number of defective pixels) is determined out of the four reference pixel rows, and then reference pixel selection information for selecting at least one reference pixel 101 is set.

The reference pixel selection information is set to the storage circuit 909 in the solid-state imaging device. Based on the set reference pixel selection information, the storage circuit 909 selects a reference pixel row. The reference pixel defect map may be acquired in advance and stored in an external storage device, or generated when the power is turned ON.

Figure 4A:
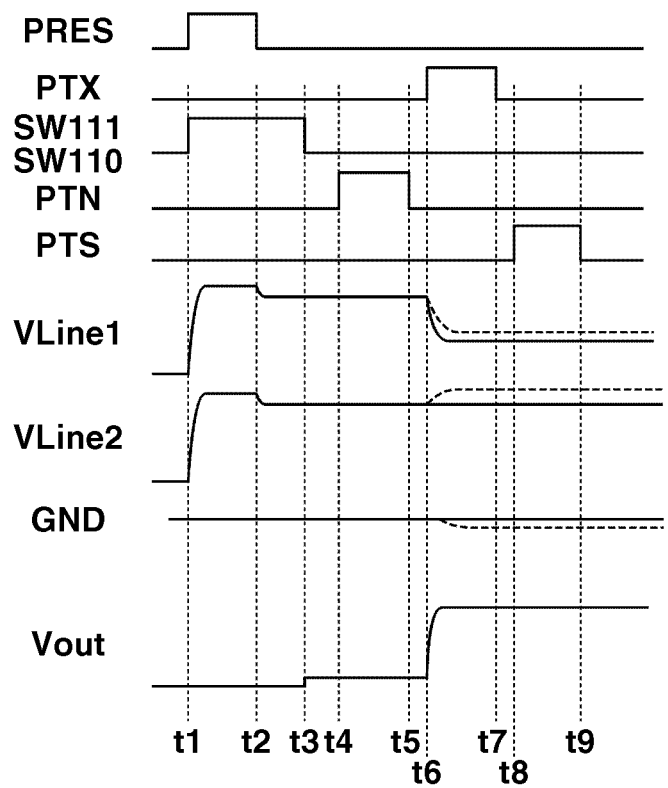
FIGS. 4A and 4B are timing charts of the solid-state imaging device according to an exemplary embodiment.

FIG. 4A is a timing chart illustrating a method for driving the solid-state imaging device illustrated in FIGS. 1 and 2. PRES indicates a pulse applied to the reset control line 208, and PSEL indicates a pulse applied to the transfer control line 207.

PTN and PTS indicate pulses applied to the signal processing circuit 113 by a timing generation unit (not illustrated). When the timing generation unit applies PTS and PTN to the signal processing circuit 113, the signal processing circuit 113 applies the second CDS (described below) to signals output from the differential amplifier 112.

VLine1 indicates the potential of the first vertical signal line 102, VLine2 indicates the potential of the second vertical signal line 103, GND indicates the potential of the GND wire 117, and Vout indicates the output potential of the differential amplifier 112.

Referring to the timing chart illustrated in FIG. 4A, when a High-level (H-level) pulse is applied to the gate of a MOS transistor, electrical conduction is established between its source and drain. On the other hand, when a Low-level (L-level) pulse is applied to the gate of the MOS transistor, electrical disconnection is established between its source and drain.

Figure 4B:
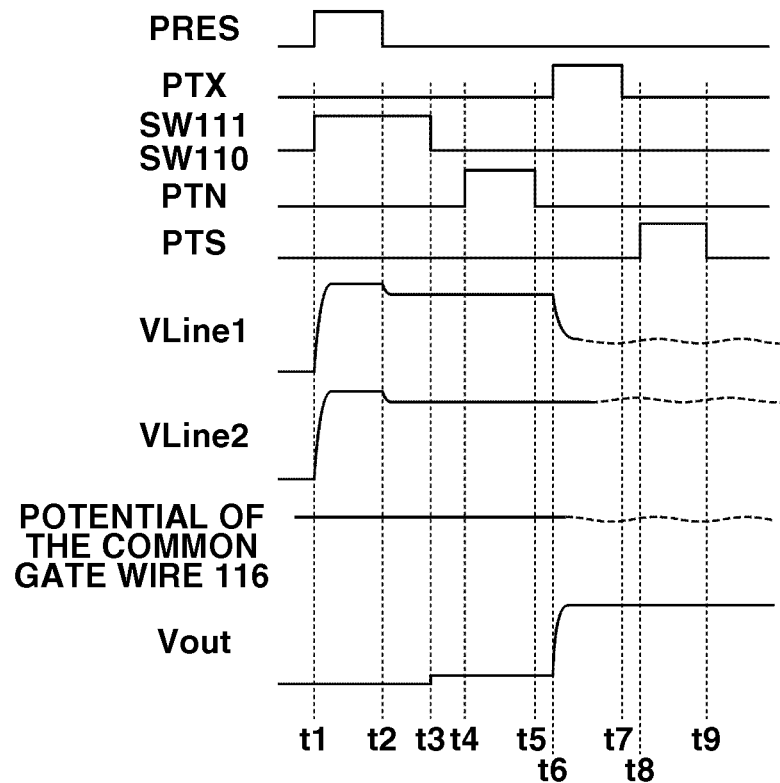

When using a MOS transistor with which electrical conduction is established between its source and drain when a L-level pulse is applied to its gate, similar operation to the present exemplary embodiment may be achieved by inverting the H and L levels of the pulses illustrated in FIGS. 4A and 4B.

The method for driving the solid-state imaging device according to the present exemplary embodiment will be described below with reference to the timing chart illustrated in FIG. 4A.

At a time t1, the vertical scanning circuit 210 sets PRES applied to the effective pixel 100 and the reference pixel 101 to the H level, and applies a signal to the reset supply line 209 to set the potential of the FD regions 203 and 213 to the reset level.

At a time t2, the vertical scanning circuit 210 sets PRES to the L level to cancel the reset state of the FD regions 203 and 213. Charge injection is generated when electrical disconnection is established between the source and drain of the reset MOS transistor 204 makes the potential of the FD regions 203 and 213 fall below the reset level. Accordingly, since the potentials of the signal output by the amplification MOS transistors 205 and 215 drop, the potentials VLine1 and VLine2 also drop.

At a time t3, the switches 110 and 111 are turned OFF and a signal output by the amplification MOS transistors 215 and 205 (hereinbelow referred to as a reset signal) is stored in the capacitances C0r and C0s, respectively.

When the switches 110 and 111 are turned OFF, charge injection is generated and the output potential Vout of the differential amplifier 112 increases. The output potential Vout in this case is represented by a formula Vout=Vref+Voff where Vref indicates the reference voltage and Voff indicates an offset voltage of the differential amplifier 112. Hereinafter, the output potential Vout of the differential amplifier 112 in this state is referred to as N signal.

At a time t4, the timing generation unit sets PTN to the H level, and the signal processing circuit 113 reads the N signal output by the differential amplifier 112. At a time t5, the timing generation unit sets PTN to the L level to end N signal readout to the signal processing circuit 113. At a time t6, the timing generation unit sets PTX (applied to the effective pixel 100 and the reference pixels 101) to the H level.

Thus, a charge generated in the photo diode 201 is transmitted to the FD region 203. A signal output by the amplification MOS transistor 205 based on the charge stored in the FD region 203 (hereinbelow referred to as a photoelectric conversion signal) is transmitted to the first vertical signal line 102. The potential of the first vertical signal line 102 drops depending on the charge stored in the FD region 203.

The photoelectric conversion of the photo diode 201 may be performed between a time t7 when PTX is set from the H level to the L level in the previous signal readout period and the time t6 in the present signal readout period. The signal readout period indicates a period between the times t1 and t9.

Since the reference pixel 101 does not perform photoelectric conversion, the potential of the FD region 213 remains unchanged since the time t5 as long as the current value supplied from the load MOS transistor 105 remains constant. Therefore, the reference signal remains unchanged since reset operation.

When the switches 110 and 111 are turned OFF at the time t3, the capacitances C0r and C0s stores the reset signal. Therefore, when the potential of the FD region 203 changes at the time t6, a signal based on a difference between the photoelectric conversion signal and the reset signal is input to the terminal of the differential amplifier 112 connected to the first vertical signal line 102.

A signal based on a difference between the reset signal stored at the time t3 and the signal output from the amplification MOS transistor 215 at the time t6 is output to the terminal of the differential amplifier 112 connected to the second vertical signal line 103.

As described above, since the reference pixel 101 does not perform photoelectric conversion, the potential VLine2 of the second vertical signal line 103 remains unchanged as long as the current value supplied from the load MOS transistor 105 remains constant. Therefore, when the potential VLine2 of the second vertical signal line 103 remains unchanged, the level at the time t3 is input as a signal to the terminal of the differential amplifier 112 connected to the second vertical signal line 103.

The first CDS is performed by the capacitances C0s and C0r through the above-described operations. The output potential Vout of the differential amplifier 112 at the time t6 is a difference between the signal output by amplifying the photoelectric conversion signal based on the capacitance ratio C0s/Cfs and the signal output by amplifying the reference signal based on the capacitance ratio C0r/Cfr. Hereinbelow, this potential difference output is referred to as an S signal.

The timing generation unit sets PTX applied to the reference pixel 101 and PTX applied to the effective pixel 100 in the Nth row belonging to the same columns as the reference pixel 101 to the H level at the same time, where N is a natural number equal to or larger than 1.

Thus, the reference signal output from the reference pixel 101 and the photoelectric conversion signal output from the effective pixel 100 in the Nth row are simultaneously input to the signal processing circuit 113.

In other words, when reading a signal based on incident light from the effective pixel 100 in the first row, the timing generation unit simultaneously sets PTX applied to the effective pixel 100 in the first row and PTX applied to the reference pixel 101 belonging to the same column as the effective pixel 100 to the H level.

The timing generation unit performs this operation when reading the photoelectric conversion signal from the effective pixel 100 in each pixel row to simultaneously read the signal from the effective pixel 100 and the reference signal.

At a time t7, the timing generation unit sets PTX from the H level to the L level to establish electrical disconnection between the photo diode 201 and the FD region 203. At a time t8, the timing generation unit sets PTS to the H level, and the S signal is read to the signal processing circuit 113.

At a time t9, the timing generation unit sets PTS to the L level to end the S signal readout by the signal processing circuit 113.

The signal processing circuit 113 outputs a difference between the read S and N signals. With this differentiation processing, the offset voltage Voff of the differential amplifier 112 contained in the S signal is canceled. In other words, the second CDS is performed by the signal processing circuit 113. Then, the signal processing circuit 113 selected by the HSR 114 outputs a signal which serves as the signal 115 output by the solid-state imaging device.

The solid-state imaging device according to the present exemplary embodiment selects the reference pixel 101 on a row basis. In comparison with the configuration with which the reference pixel 101 is selected on a pixel basis, the above-described configuration enables reducing the arrangement area of the reference selection unit 905 and also improving the degree of freedom of positioning the reference selection unit 905 within the solid-state imaging device. Further, 2-bit information is sufficient as reference pixel selection information for selecting one of four rows.

When one reference pixel 101 is used to acquire a difference from signals output by the effective pixels 100 as with the configuration discussed in Japanese Patent Application Laid-Open No. 2008-271280, acquiring normal reference signals becomes difficult if the one reference pixel 101 is defective.

Therefore, it may be impossible to correctly obtain a signal of a difference between the signal output by the effective pixels 100 and the reference signal. In this case, linear striped patterns may arise in a captured image.

The solid-state imaging device according to the present exemplary embodiment is capable of selecting at least one reference signal output pixel from the reference pixels 101. With this configuration, even if any one of the reference pixels 101A to 101D used to acquire a difference from signals output by the effective pixels 100 is defective, linear striped patterns may be prevented by selecting an output of any one normal reference pixel 101.

The solid-state imaging device according to the present exemplary embodiment includes the amplification MOS transistors 205 and 215 separately from the differential amplifier 112. Therefore, in comparison with the configuration with which an amplification MOS transistor also serves as an input stage of a differential pair, the solid-state imaging device according to the present exemplary embodiment improves the degree of freedom of setting parameters of the amplification MOS transistors 205 and 215.

Parameters herein refers to various elements that affect transistor operations, such as the gate area, voltage amplification factor, current amplification factor, threshold voltage, permissible loss.

With the solid-state imaging device discussed in Japanese Patent Application Laid-Open No. 2008-271280, in order to obtain a difference between signals output by effective and reference pixels and to reduce noise overlapped on signals output by effective pixels with sufficient accuracy, it is necessary to provide the same capacitance ratio of the micro capacitance Cio to the floating diffusion capacitance Cfd for effective and reference pixels.

To reduce 1/f noise without reducing the area of the photo diode 201 of the effective pixel 100, the gate area of the amplification MOS transistor 215 of the reference pixel 101 may be possibly increased.

With the circuit configuration discussed in Japanese Patent Application Laid-Open No. 2008-271280, since increasing the gate area of an amplification MOS transistor of a reference pixel increases the floating diffusion capacitance Cfd with increasing parasitic capacitance, it is necessary to adjust the capacitance ratio of the micro capacitance Cio and the floating diffusion capacitance Cfd.

With the configuration according to the present exemplary embodiment, on the other hand, neither the effective pixel 100 nor the reference pixel 101 includes the micro capacitance Cio. Therefore, the present exemplary embodiment may increase the gate area of the amplification MOS transistor 215 without adjusting the capacitance ratio of the micro capacitance Cio and the floating diffusion capacitance Cfd, thus reducing 1/f noise effect.

The reference pixels 101 are arranged outside the photoelectric conversion signal output pixel region 120. Thus, it is possible to increase the gate (control electrode) area of the amplification MOS transistor 215 in the reference pixel 101 without reducing the area of the photo diode 201, thus reducing 1/f noise effect.

Further, the reference pixels 101 are arranged closer to the differential amplifier 112 than the effective pixel 100. This enables shortening the wiring length of the second vertical signal line 103 and also preventing the second vertical signal line 103 from entering the photoelectric conversion signal output pixel region 120. Therefore, the area of the photo diode 201 is not reduced.

Even when equalizing the gate area of the amplification MOS transistor 205 to that of the amplification MOS transistor 215, the solid-state imaging device according to the present exemplary embodiment enables designing the differential amplifier 112 independently of the parameters of the amplification MOS transistors 205 and 215.

Further, the voltage source Vdd of the effective pixel 100 and the reference pixels 101 is provided separately from a power supply (not illustrated) of the differential amplifier 112. This enables the differential amplifier 112 to operate on a voltage different from the voltage source Vdd for supplying a voltage to the effective pixel 100 and the reference pixels 101.

Also when making the amplification MOS transistor 215 smaller than the amplification MOS transistor 205, the solid-state imaging device according to the present exemplary embodiment enables designing the differential amplifier 112 independently of the parameters of the amplification MOS transistors 205 and 215. Further, since the amplification MOS transistor 215 may be made smaller and accordingly the area of the photoelectric conversion signal output pixel region 120 may be increased, the area of the photo diode 201 of the effective pixel 100 may be increased. Thus, sensitivity degradation may be reduced.

With the solid-state imaging device discussed in Japanese Patent Application Laid-Open No. 2008-271280, a current source connected to the vertical signal line supplies a current from the source electrode to the signal line via the gate and drain electrodes. Therefore, when an effective pixel for signal readout is selected, the current value of the current flowing through the vertical signal line temporarily varies.

The time until the current value becomes stable is controlled by the current value of the current source of the differential amplifier circuit. Therefore, to read a signal without being affected by variation in the current value of the signal line, it is necessary to provide a wait time since an effective pixel is selected until the current value of the current flowing through the vertical signal line becomes stable.

On the other hand, with the solid-state imaging device described in the present exemplary embodiment, since the output of each pixel is given as an output voltage from a source follower circuit, potential variation in the vertical signal line is not controlled by the current value flowing through the current source. Therefore, when vertically scanning the effective pixels 100 to read photoelectric conversion signals, the solid-state imaging device according to the present exemplary embodiment provides a shorter wait time since an effective pixel is selected until the current flowing through the signal line becomes stable than the solid-state imaging device discussed in Japanese Patent Application Laid-Open No. 2008-271280.

With the solid-state imaging device discussed in Japanese Patent Application Laid-Open No. 2008-271280, an effective pixel includes the micro capacitance Cio and the floating diffusion capacitance Cfd.

With the solid-state imaging device according to the present exemplary embodiment, on the other hand, the effective pixels 100 do not include the micro capacitance Cio. Assuming a case of providing the same number of effective pixels in the same area, the solid-state imaging device according to the present exemplary embodiment provides a larger area of the photoelectric conversion unit than the solid-state imaging device discussed in Japanese Patent Application Laid-Open No. 2008-271280. Thus, sensitivity degradation may be reduced.

The dotted lines illustrated for VLine1, VLine2, and GND in FIG. 4A will be described below. The solid-state imaging device according to the present exemplary embodiment may reduce horizontal smear and horizontal striped patterns which may be a problem in an image output by the solid-state imaging device. The process of reducing horizontal smear and horizontal striped patterns will be described below.

Suppose a case where some of the effective pixels 100 in the photoelectric conversion signal output pixel region 120 on which strong incident light is incident. The potential of the first vertical signal line 102 largely drops by photoelectric conversion signals from the effective pixels 100 on which strong incident light is incident.

If incident light is very strong, the voltage between the source and drain of the load MOS transistor 104 comes close to 0 V. If incident light is especially strong, the load MOS transistors 104 will turn OFF.

The amount of current flowing through the GND wire 117 depends on the number of load MOS transistors 104 which are OFF. The impedance of the GND wire 117 and the current flowing through the GND wire 117 produce a voltage drop in the GND wire 117, which changes the current flowing through the load MOS transistors 104 and 105.

The more the number of effective pixels 100 on which strong light is incident, the more the number of load MOS transistors 104 which are OFF, the smaller the voltage drop in the GND wire 117, and the more the current flowing through the load MOS transistors 104 and 105. This increases the potential difference between the gate and source of each of the amplification MOS transistors 205 and 215.

Because the potential difference between the gate and source of the amplification MOS transistor 205 increases, an output range of the photoelectric conversion signal differs between a row including effective pixels 100 on which strong light is incident and a row not including thereof. As a result, when the reference pixels 101 are not provided, horizontal smear may arise, i.e., whitish stripe-shaped patterns arise on both sides of a spot in an image subjected to strong incident spot light.

The solid-state imaging device according to the present exemplary embodiment includes reference pixels 101. The second vertical signal line 103 is electrically connected to the common gate wire 116 and the common GND wire 117 via the load MOS transistor 105.

With this configuration, when strong incident light enters the effective pixel 100, the potential difference between the source and gate of the amplification MOS transistor 205 of the effective pixel 100 increases. Similarly, the potential difference between the source and gate of the amplification MOS transistor 215 of the reference pixel 101 increases.

Since the S signal from the differential amplifier 112 is a difference between the photoelectric conversion signal and the reference signal, the effect of the increased potential difference between the source and gate of the amplification MOS transistors 205 and 215 may be canceled. Thus, the occurrence of horizontal smear may be reduced.

The solid-state imaging device according to the present exemplary embodiment also may reduce horizontal striped patterns that cause image quality degradation like horizontal smear. A process of reducing horizontal striped patterns will be described below.

FIG. 4B is a timing chart illustrating a case where the potential of the common gate wire 116 varies. The timing chart in FIG. 4B is similar to the timing chart in FIG. 4A except for the potentials VLine1 and VLine2. Referring to FIG. 4B, potential variation in the common gate wire 116 (illustrated by dotted lines) is caused by random noise generated from the power supply circuit for supplying a voltage to the common gate wire 116, and kickback noise generated from other circuits.

Potential variation in the common gate wire 116 changes the current flowing through the load MOS transistors 104 and accordingly changes an output range of the photoelectric conversion signal of the entire row currently selected for signal readout. Thus, when the reference pixels 101 are not provided, in an image involving potential variation in the common gate wire 116, horizontal striped patterns are caused by a difference between the signal output by a row not involving potential variation and the signal output by a row involving potential variation.

In the present exemplary embodiment, potential variation in the common gate wire 116 equally affects the load MOS transistors 104 and 105. Therefore, as illustrated in FIG. 4B, potential variation in the common gate wire 116 causes an equal variation in potentials VLine1 and VLine2.

Since the N and S signals from the differential amplifier 112 are a difference between the signal from the effective pixel 100 and the reference signal, the effect of potential variation in the common gate wire 116 may be canceled. Therefore, even if potential variation in the common gate wire 116 arises, the difference in the output range of the photoelectric conversion signal between a row not involving potential variation and a row involving potential variation remains unchanged. Thus, horizontal striped patterns in the acquired image may be reduced.

In the present exemplary embodiment, to reduce horizontal smear and horizontal striped patterns which may be a problem in an image output by the solid-state imaging device, the load MOS transistors 104 and 105 are connected to the common gate wire 116 and the common GND wire 117.

However, the load MOS transistors 104 and 105 may be connected not to the common gate wire 116 and the common GND wire 117 but to different gate and GND wires. Specifically, at least one reference pixel 101 for outputting a reference signal may be selected from the reference pixels 101.

Although, in the reset operation performed between the times t1 and t2, the potential of the FD regions 203 and 213 are reset, PTX may be set to the H level to reset the potential of the photo diode 201 and the capacitance 211.

In this case, photoelectric conversion of the photo diode 201 may be performed between the time t2 when PRES and PTX are set to the L level and the time t6 when PTX is set to the H level next time.

In the present exemplary embodiment, the reset operation for the FD region 213 of the reference pixel 101 is ended at the time t2, simultaneously with the reset operation for the FD region 203 of the effective pixel 100. However, since the reference pixel 101 does not perform photoelectric conversion, the potential of the reset level may be kept being applied to the FD region 213 without ending the reset operation.

The switches 110 and 111 may be turned OFF from ON between the times t2 and t4. That is, the timing when the switches 110 and 111 are turned ON does not necessarily need to coincide with the time t1 when PRES is set to the H level. It is allowable that they are turned ON between the times t1 and t4.

It is preferable that transmissions of the photoelectric conversion signal and the reference signal to the differential amplifier 112 are simultaneously ended. The current values supplied by the load MOS transistors 104 and 105 may vary, and the amounts of variation in the current value may differ with time.

In this case, if the timing when readout of the photoelectric conversion signal is ended is set different from the timing when readout of the reference signal is ended, the amount of variation in the current value may be different between the load MOS transistors 104 and 105, which is contained in respective signals stored in the signal processing circuit 113. Therefore, even if the signal processing circuit 113 obtains a difference of each signal, the effect by variation in the current value supplied by the load MOS transistors 104 and 105 may not be canceled.

In the present exemplary embodiment, descriptions have been made on the premise that the reference pixel 101 includes the capacitance 211, the FD region 213, and the reset MOS transistor 204. However, the reference pixel 101 may include at least the amplification MOS transistor 215 for outputting a signal based on a voltage applied to its gate.

More specifically, instead of providing the reset MOS transistor 204, it is also possible that a voltage supply line is connected to the gate of the amplification MOS transistor 215, and that the amplification MOS transistor 215 outputs a signal based on a voltage supplied from the voltage supply line.

Omitting the FD region 213 (charge storage portion), the capacitance 211, transfer MOS transistor 202, etc. in this way enables designing a larger gate area of the amplification MOS transistor 215.

In the present exemplary embodiment, the reference pixel 101 includes the capacitance 211 for storing a charge. As another configuration, for example, the FD region 213 may store a charge instead of the capacitance 211 illustrated in FIG. 2.

Further, as illustrated in FIG. 2, the capacitance 211 may be provided separately from the FD region 213, and the photo diode 201 may be provided like the effective pixel 100. When the photo diode 201 is provided, using the reference pixel 101 as an optical black pixel with which light to the photo diode 201 is blocked enables obtaining a reference signal from the reference pixel 101.

Although, in the present exemplary embodiment, the amplification MOS transistor 205 of each effective pixel 100 is electrically connected to the first vertical signal line 102, the configuration is not limited thereto. For example, the reset MOS transistor 204 and the FD region 203 may be shared by a plurality of effective pixels 100. In other words, a plurality of photo diodes 201 and FD regions 203 may be connected to one amplification MOS transistor 205.

In the present exemplary embodiment, in each pixel column, the reference pixels 101 are provided at an end on one side of the photoelectric conversion signal output pixel region 120.

As another configuration, the reference pixels 101 may be arranged so as to sandwich the photoelectric conversion signal output pixel region 120. Further, alternately every other column, the reference pixels 101 may be arranged so as to sandwich the photoelectric conversion signal output pixel region 120. This alternate arrangement may be made in units of a plurality of columns.

Similarly, alternately every other column, the differential amplifiers 112 may be arranged so as to sandwich the photoelectric conversion signal output pixel region 120. This alternate arrangement may be made not every other column but in units of a plurality of columns.

When the signal processing circuit 113 outputs an analog signal, it is preferable to provide an A/D converter for converting the analog signal output by the signal processing circuit 113 into a digital signal. The A/D converter is referred to as analog-to-digital conversion unit.

The differential signal output unit 140 according to the present exemplary embodiment is the differential amplifier 112. As another configuration, the differential signal output unit 140 may include a differential amplifier 129 electrically connected to the signal processing circuit 113, as illustrated in FIG. 5.

Figure 5:
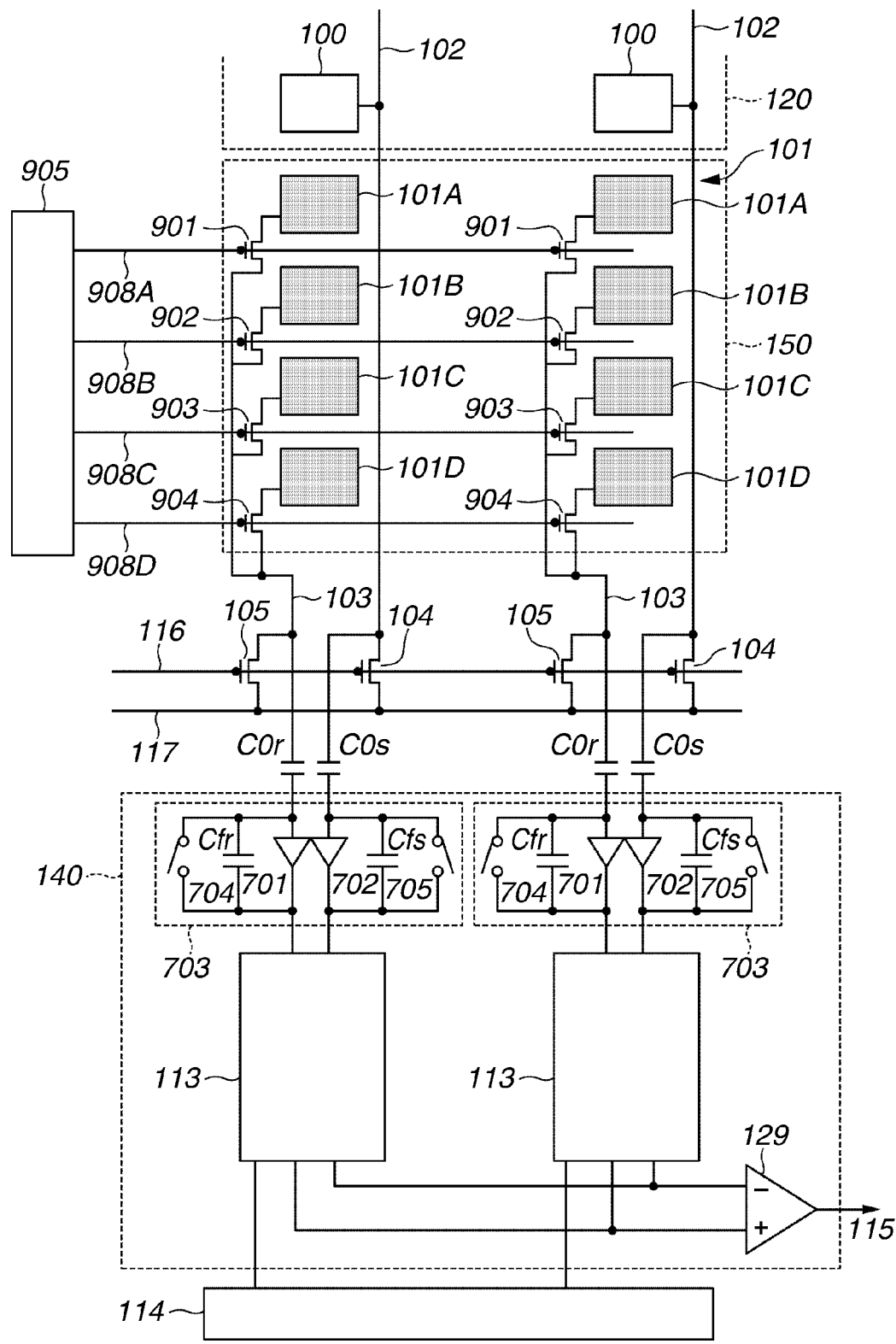
FIG. 5 is a block diagram illustrating a solid-state imaging device according to another exemplary embodiment.

With the solid-state imaging device illustrated in FIG. 5, elements having the same functions as those illustrated in FIG. 1 are assigned the same reference numerals, and duplicate descriptions will be omitted. Inverting amplifiers 701 and 702 are first and second amplification units, respectively. By using common voltage and current sources, the inverting amplifiers 701 and 702 form an amplifier circuit 703.

It is desirable to adjacently arrange the inverting amplifiers 701 and 702 so that they output signal levels having ranges as equal as possible. The inverting amplifiers 701 and 702 are possibly formed of a source common circuit.

Switches 704 and 705 are used to select whether the input and output terminals of the inverting amplifiers 701 and 702, respectively, are short-circuited or not. When the switches 704 and 705 are turned ON (conductive state), charges in the capacitances Cfr and Cfs are discharged and reset, respectively.

In this case, the signal processing circuit 113 separately outputs two different signals, i.e., a signal based on the output from the inverting amplifier 701 and a signal based on the output from the inverting amplifier 702, to the differential amplifier 129. Then, the differential amplifier 129 outputs a difference between the two signals output by the signal processing circuit 113.

With this configuration, the signal output from the differential amplifier 129 is the signal 115 output by the solid-state imaging device. Noise generated in the amplifier circuit 703 or on the side of the signal processing circuit 113 therefrom is overlapped on the outputs of the effective pixel 100 and the reference pixel 101.

Therefore, obtaining a difference between outputs of the effective pixel 100 and the reference pixel 101 by the signal processing circuit 113 enables canceling noise generated in the amplifier circuit 703 and on the side of the signal processing circuit 113 therefrom. Thus, noise contained in the signal 115 output by the imaging device may be reduced.

Therefore, noise contained in the signal 115, generated in the amplifier circuit 703 and on the side of the signal processing circuit 113 therefrom, may be reduced. Thus, a favorable image having little noise may be obtained.

As another configuration, each signal processing circuit 113 may include the differential amplifier 129. This configuration also enables obtaining the signal 115 with reduced noise generated in the amplifier circuit 703.

In the present exemplary embodiment, a pixel is formed of three different MOS transistors such as a transfer MOS transistor, an amplification MOS transistor, and a reset MOS transistor.

A pixel may further include a selection MOS transistor. The gate of the selection MOS transistor is electrically connected with the vertical scanning circuit 210. Further, one of the drain and source is electrically connected to the first vertical signal line 102 or the second vertical signal line 103, and the other is electrically connected to the amplification MOS transistor 205 or the amplification MOS transistor 215.

The vertical scanning circuit 210 applies a pulse to the gate of the selection MOS transistor of the pixel for outputting a signal to the first vertical signal line 102 or the second vertical signal line 103. Then, the selected pixel outputs a signal to the first vertical signal line 102 or the second vertical signal line 103.

Although, in the present exemplary embodiment, a pixel is formed of MOS transistors, the configuration is not limited thereto. For example, the reset and transfer transistors in a pixel may be bipolar transistors. Further, the amplification transistor may be a junction field effect transistor (JFET).

With the solid-state imaging device illustrated in FIG. 1, the reference pixels 101 are arranged only at an end of the pixel region (where the effective pixel 100 and the reference pixels 101 are arranged) on the side of the differential amplifier 112. However, the present exemplary embodiment is not limited to this configuration. For example, the reference pixels 101 may be arranged at an end of the pixel region on the opposite side of the differential amplifier 112 so as to sandwich the photoelectric conversion signal output pixel region 120.

In the present exemplary embodiment, the effective pixels 100 are arranged in a plurality of rows and a plurality of columns, and the reference pixels 101 are arranged in a plurality of columns. The effective pixels 100 may be arranged in one or more rows and in one or more columns.

In this case, the differential amplifier 112, the first vertical signal line 102, and the second vertical signal line 103 may be arranged in each pixel column. This configuration also enables increasing the gate (control electrode) area of the amplification MOS transistor 215 of the reference pixel 101 without reducing the area of the photoelectric conversion unit of the effective pixel 100. Thus, a photoelectric conversion signal having little 1/f noise may be obtained.

Although, in the present exemplary embodiment, the storage circuit 909 stores the reference pixel selection information, the embodiment is not limited to this configuration. For example, a solid-state imaging system includes a solid-state imaging device, an output signal processing unit for processing the signal output by the solid-state imaging device, a timing generation unit for supplying drive timing signals to the solid-state imaging device, and a total control and calculation unit for controlling the timing generation unit.

With this configuration of the solid-state imaging system, for example, the total control and calculation unit may store the reference pixel selection information.

Although, in the present exemplary embodiment, four reference pixels 101A to 101D are arranged as the reference pixels 101, the effect of the present exemplary embodiment may be suitably obtained if two or more reference pixels 101 are arranged.

Although, in the present exemplary embodiment, one reference pixel 101 for outputting a reference signal is selected, a plurality of reference pixels 101 may be selected for this purpose. More specifically, one to four reference pixels may be simultaneously selected from the reference pixels 101A to 101D based on defect levels, and one to four reference signals may be output to the differential amplifier 112.

A second exemplary embodiment will be described below with reference to the accompanying drawings, centering on differences from the first exemplary embodiment. The solid-state imaging device according to the present exemplary embodiment includes a plurality of blocks each including the reference pixels 101 arranged in a plurality of columns.

Figure 6:
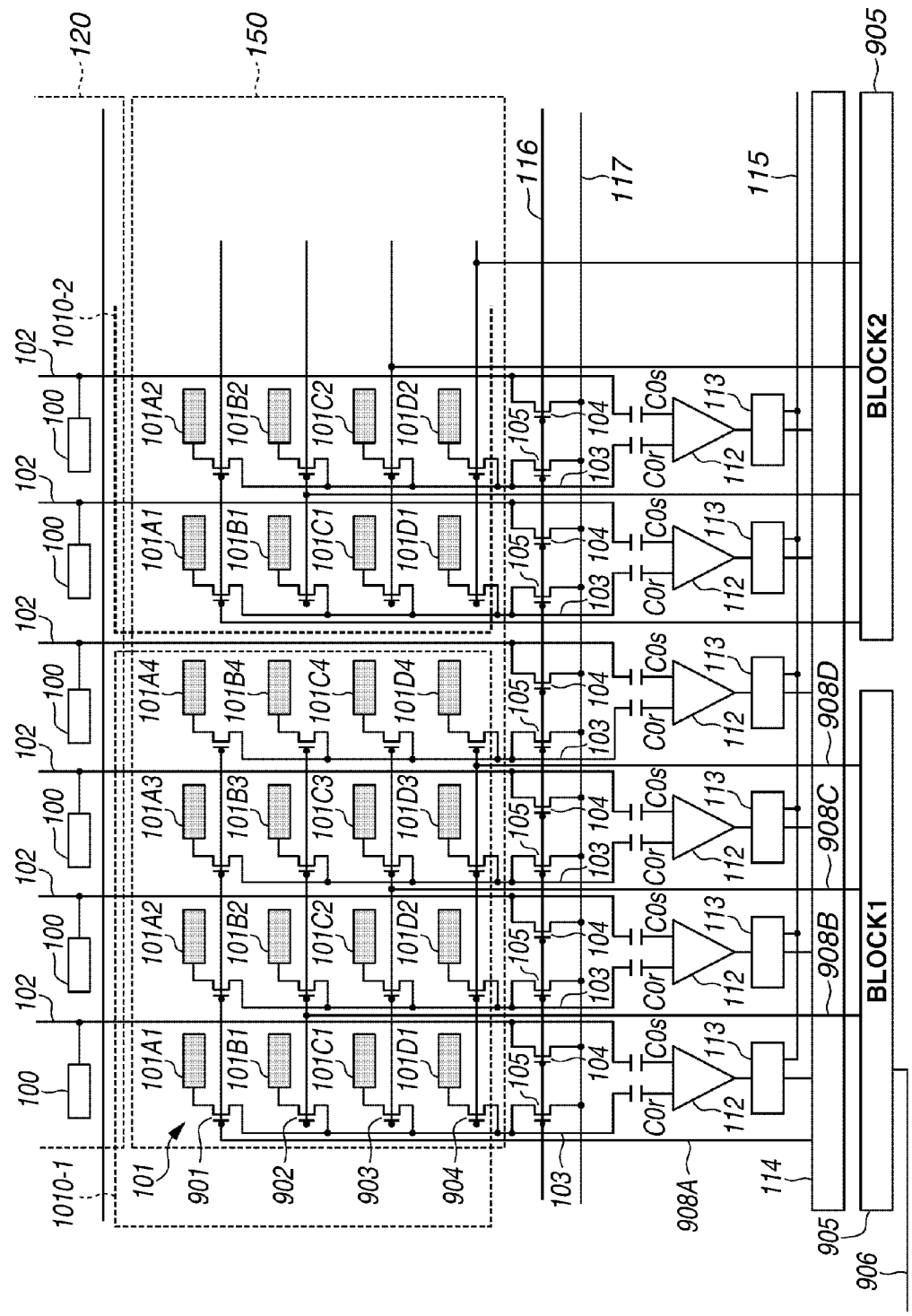
FIG. 6 is a block diagram illustrating a solid-state imaging device according to still another exemplary embodiment.

FIG. 6 is a block diagram illustrating a solid-state imaging device according to the present exemplary embodiment. With the solid-state imaging device illustrated in FIG. 6, elements having the same functions as those illustrated in FIG. 1 are assigned the same reference numerals, and duplicate descriptions will be omitted.

Equivalent circuits of an effective pixel 100 and a reference pixel 101 are similar to the respective equivalent circuits according to the first exemplary embodiment (see FIG. 2). The solid-state imaging device illustrated in FIG. 6 includes a plurality of blocks 1010 each including four columns of reference pixels 101.

Referring to FIG. 6, the four columns of reference pixels 101 included in one block 1010 are illustrated as reference pixels 101A1 to 101A4, 101B1 to 101B4, 101C1 to 101C4, and 101D1 to 101D4. Each block 1010 including the four columns of reference pixels 101 includes the reference selection unit 905.

In a block 1010-1, each of reference signal selection switches 901 to 904 is electrically connected to the reference selection unit 905 (BLOCK1). Similarly, in a block 1010-2, each of reference signal selection switches 901 to 904 is electrically connected to the reference selection unit 905 (BLOCK2).

In one block, the reference selection unit 905 selects, on a row basis, the reference pixels 101 to be electrically connected to the second vertical signal line 103. Accordingly, to select the reference pixels 101A1 to 101A4 in the first row, for example, the reference selection unit 905 sets the potential of the reference selection line 908A to the H level.

Similarly, to select the reference pixels 101B1 to 101B4 in the second row, the reference pixels 101C1 to 101C4 in the third row, and the reference pixels 101D1 to 101D4 in the fourth row, the reference selection unit 905 sets the potential of the reference selection lines 908B, 908C, and 908D to the H level, respectively.

Figure 7:
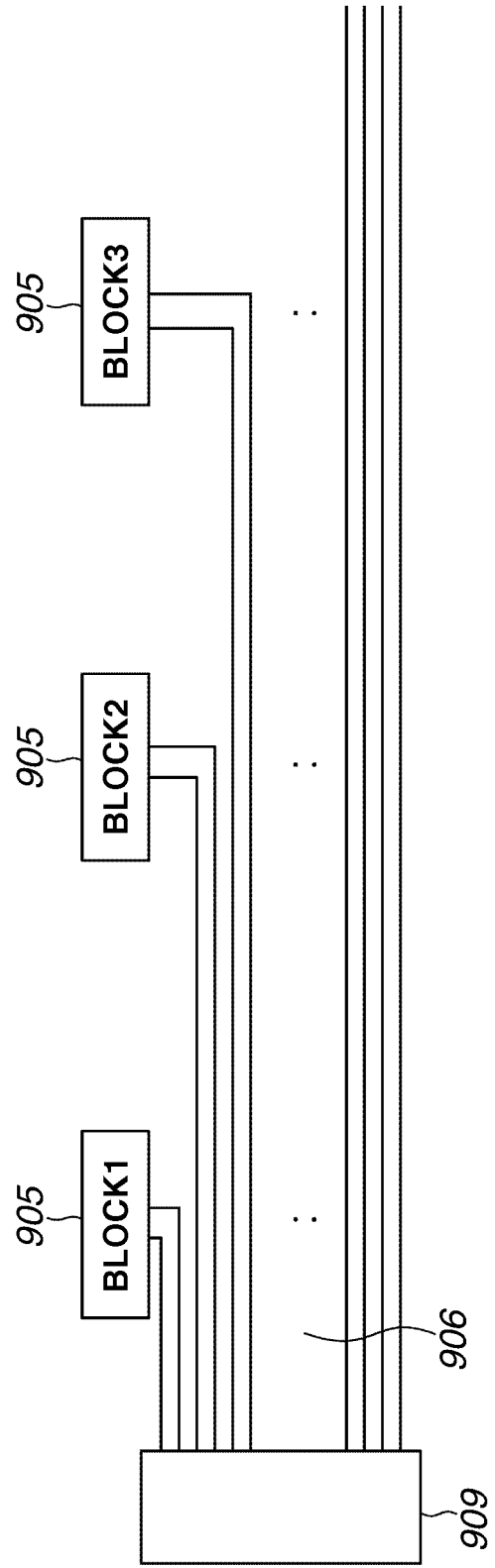
FIG. 7 is a block diagram illustrating an arrangement of reference selection units of the solid-state imaging device according to still another exemplary embodiment.

Referring to FIG. 7, the control lines 906 transmit the reference pixel selection information from the storage circuit 909 to the reference selection units 905. The reference selection units 905 may be, for example, demultiplexers.

Based on the received reference pixel selection information, the reference selection unit 905 selects at least one reference pixel 101 for outputting a reference signal to the second vertical signal line 103. In the present exemplary embodiment, in each block, the reference selection unit 905 selects one of the four rows of the reference pixels 101.

FIG. 7 illustrates an overall pixel arrangement when the control lines 906 are formed with 1-layer wiring. This case requires a large arrangement area and accordingly a large chip size.

The 2-bit control lines 906 are arranged with 2-layer wiring with which one bit line is arranged in a first wiring layer AL1 (not illustrated) and the other bit line is arranged in a second layer wiring AL2 (not illustrated). This wiring method enables reducing the wire arrangement area to about a half of that in a case where the control lines 906 are arranged with 1-layer wiring. The use of multi-layer wiring enables further reducing the wire arrangement area.

The operations of the solid-state imaging device according to the present exemplary embodiment illustrated in FIGS. 6 and 7 may be similar to the operations illustrated in FIGS. 4A and 4B.

The present exemplary embodiment is characterized in that reference pixel rows may be selected on a block basis. Thus, in comparison with the first exemplary embodiment, the present exemplary embodiment enables selecting reference pixel rows in different ways for each block, thus improving the degree of freedom of selecting a combination of reference pixel rows. Therefore, in selecting reference pixels in the solid-state imaging device, the present exemplary embodiment enables selecting a combination of reference pixel rows including less number of defective reference pixels.

In the present exemplary embodiment, a plurality of reference selection units 905 is arranged in the horizontal scanning direction. As another configuration, the reference selection units 905 may be arranged between columns including pixels.

In addition, the present exemplary embodiment does not limit arrangement positions of the reference selection units 905, and may be suitably embodied as long as reference pixel rows may be selected on a block basis.

Also in the present exemplary embodiment, at least one reference pixel 101 for outputting a reference signal is selected from the reference pixels 101A to 101D. Thus, the solid-state imaging device according to the present exemplary embodiment also achieves the same effect as that achieved by the solid-state imaging device according to the first exemplary embodiment.

A third exemplary embodiment will be described below with reference to the accompanying drawings, centering on differences from the first exemplary embodiment. The present exemplary embodiment is characterized in that one reference pixel group, including the reference pixels 101A to 101D arranged in a column, is electrically connected to a plurality of differential amplifiers 112 in common.

Figure 8:
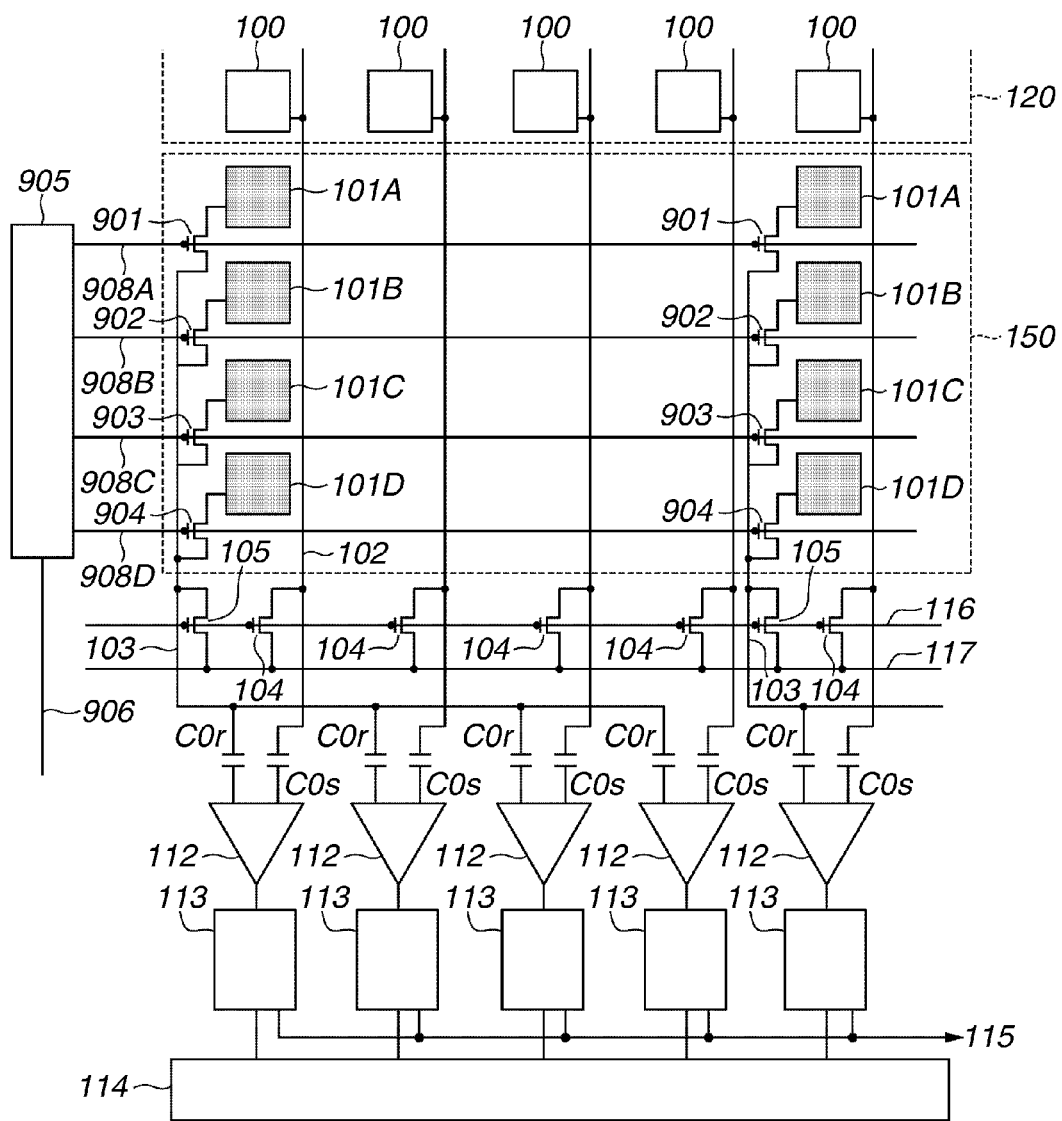
FIG. 8 is a block diagram illustrating a solid-state imaging device according to still another exemplary embodiment.

FIG. 8 is a block diagram illustrating a solid-state imaging device according to the present exemplary embodiment. With the solid-state imaging device illustrated in FIG. 8, elements having the same functions as those illustrated in FIG. 1 are assigned the same reference numerals, and duplicate descriptions will be omitted. Equivalent circuits of an effective pixel 100 and a reference pixel 101 are similar to the respective equivalent circuits according to the first exemplary embodiment (see FIG. 2).

The present exemplary embodiment is characterized in that four columns of effective pixels 100 share four reference pixels 101. In the present exemplary embodiment, one second vertical output line 103 is electrically connected to four columns of differential amplifiers 112. Therefore, a common reference signal is applied to the differential amplifiers 112 in four columns.

With the solid-state imaging device according to the first exemplary embodiment, reference signals are applied from different reference pixels 101 to the differential amplifier 112 on a column basis. With this configuration, the second vertical output lines 103 electrically connected to respective differential amplifiers 112 are driven independently of each other.

With the solid-state imaging device according to the present exemplary embodiment, on the other hand, the second vertical signal line 103 is electrically connected to four differential amplifiers 112 in common, providing smaller current consumption than the solid-state imaging device according to the first exemplary embodiment.

In comparison with the solid-state imaging device according to the first exemplary embodiment, the solid-state imaging device according to the present exemplary embodiment also reduces current consumption by using less number of reference pixels 101 included in the four columns of effective pixels 100.

Also in the present exemplary embodiment, at least one reference pixel 101 for outputting a reference signal is selected from the reference pixels 101A to 101D. Thus, the solid-state imaging device according to the present exemplary embodiment also achieves the same effect as that achieved by the solid-state imaging device according to the first exemplary embodiment.

Figure 9:
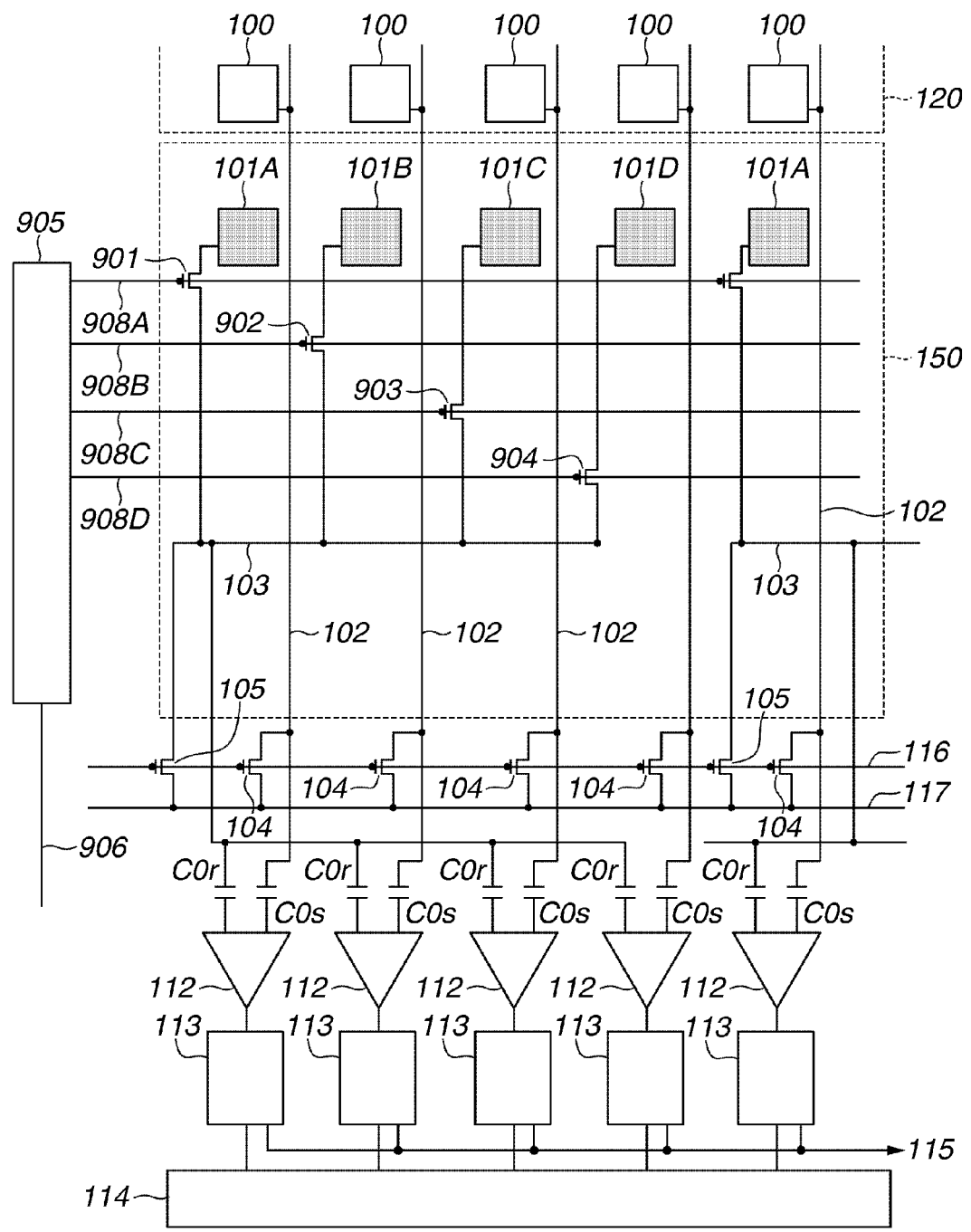
FIG. 9 is a block diagram illustrating a solid-state imaging device according to still another exemplary embodiment.

In the present exemplary embodiment, the four reference pixels 101A to 101D are arranged in a column. As another configuration, as illustrated in FIG. 9, the reference pixels 101A to 101D may be arranged in a row, and one reference pixel group may be electrically connected to the four differential amplifiers 112 in common.

With this configuration, in comparison with the configuration with which the reference pixels 101A to 101D are arranged in a column, the area of the reference signal output pixel region 150 may be reduced. As a result, the chip size of the solid-state imaging device may be reduced.

In the present exemplary embodiment, one reference pixel group is electrically connected to the four differential amplifiers 112 in common. Further, increasing the number of differential amplifiers 112 electrically connected to one reference pixel group in common enables further reducing current consumption in comparison with the solid-state imaging device according to the first exemplary embodiment.

Further, combining the second exemplary embodiment with the present exemplary embodiment enables sharing the reference pixels 101 used in the block described in the second exemplary embodiment. For example, sharing the four reference pixels 101 by a plurality of columns enables reducing current consumption.

Since the reference selection units 905 may be arranged in the region of the reference pixels 101 which became unnecessary through the above-described sharing of the reference pixels 101, the increase of the chip area of the solid-state imaging device may be reduced.

Figure 10:
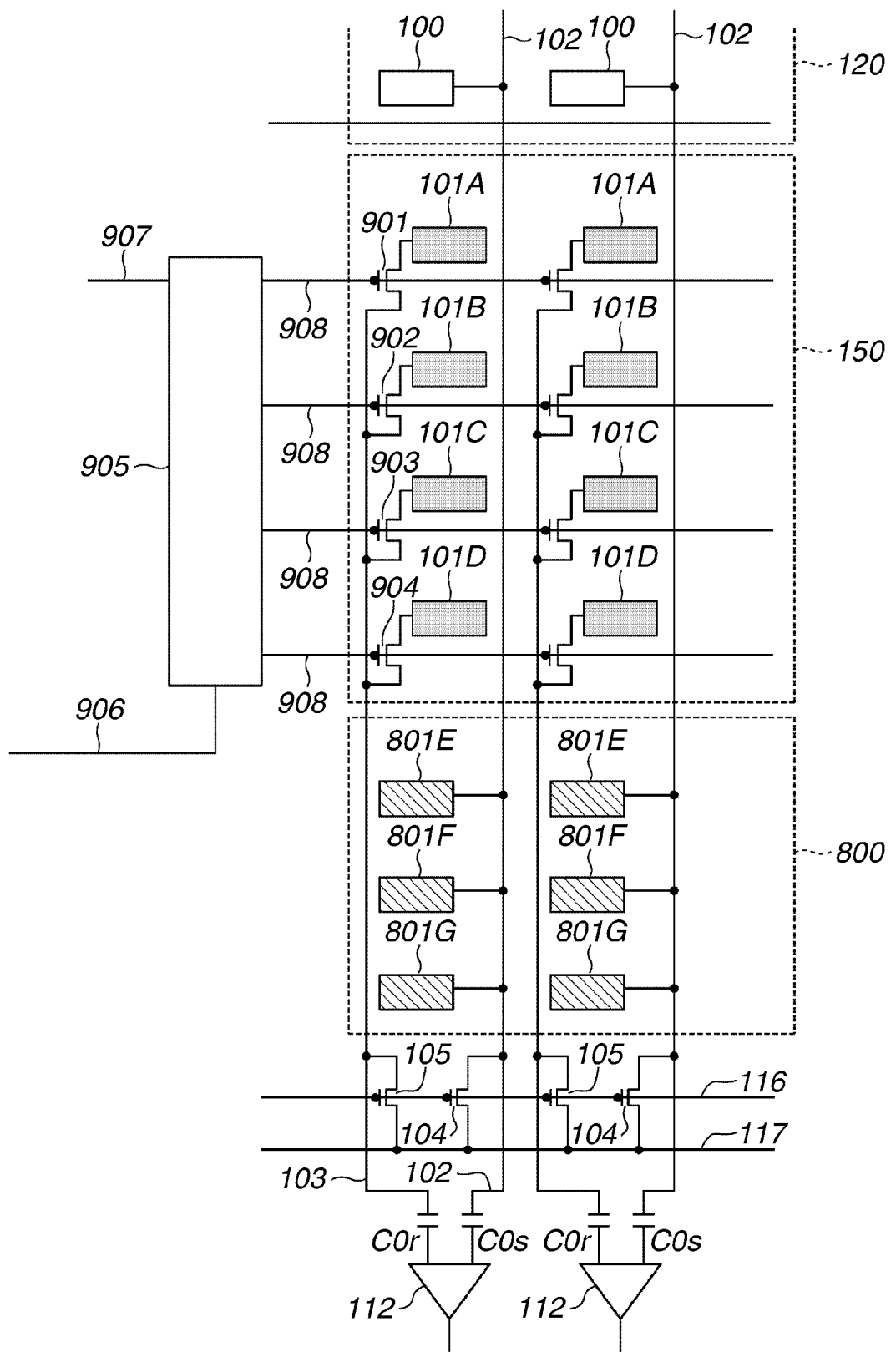
FIG. 10 is a block diagram illustrating a solid-state imaging device according to still another exemplary embodiment.

A fourth exemplary embodiment will be described below with reference to the accompanying drawings, centering on differences from the first exemplary embodiment. FIG. 10 is a block diagram illustrating a solid-state imaging device according to the present exemplary embodiment.

With the solid-state imaging device illustrated in FIG. 10, elements having the same functions as those illustrated in FIG. 1 are assigned the same reference numerals, and duplicate descriptions will be omitted. Equivalent circuits of an effective pixel 100 and a reference pixel 101 are similar to the respective equivalent circuits according to the first exemplary embodiment (see FIG. 2).

With the solid-state imaging device illustrated in FIG. 10, four reference pixels 101A to 101D and three optical black pixels 801E to 801G are arranged in each pixel column including the effective pixel 100.

An optical black pixel 801 has a similar structure to the effective pixel 100 with which light to the photo diode 201 is blocked. Signal output operations of the optical black pixels 801 are similar to those of the effective pixels 100 (see FIG. 2). A region where the optical black pixels 801E to 801G are arranged is an optical black pixel region 800.

The present exemplary embodiment is characterized in that the reference pixels 101 are arranged between the optical black pixels 801 and the effective pixels 100. In other words, the reference signal output pixel region 150 is arranged between the photoelectric conversion signal output pixel region 120 and the optical black pixel region 800. Thus, the optical black pixels 801 are arranged closer to the differential amplifier 112 than all of the reference pixels 101 belonging to the same column.

In addition, the optical black pixels 801 are arranged at an end of the pixel region (where the effective pixels 100, the reference pixels 101, and the optical black pixels 801 are arranged) on the side of the differential amplifiers 112.

This means that an end of the optical black pixels 801 on the side of the differential amplifiers 112 is closer to the differential amplifiers 112 than an end of the reference pixels 101 on the side of the differential amplifiers 112.

If the optical black pixels 801 are arranged adjacent to the effective pixels 100, high-intensity incident light may cause a certain phenomenon. Specifically, in this case, photoelectric conversion signals of the effective pixels 100 may affect signals output by the optical black pixels 801 close to the effective pixels 100 (this phenomenon is referred to as blooming). Accordingly, signals output by the optical black pixels 801 degrade in accuracy.

Arranging the reference pixels 101 between the optical black pixels 801 and the effective pixels 100 as the present exemplary embodiment enables reducing blooming effect by the effective pixels 100 on the optical black pixels 801.

Although, in the present exemplary embodiment, three optical black pixels 801 are arranged in each pixel column including the effective pixel 100, the configuration is not limited thereto.

More specifically, it is allowable that one or more optical black pixels 801 are arranged in each pixel column including the effective pixel 100. Further, the optical black pixels 801 may be shared by a plurality of columns.

Also in the present exemplary embodiment, at least one reference pixel 101 for outputting a reference signal is selected from the reference pixels 101A to 101D. Thus, the solid-state imaging device according to the present exemplary embodiment also achieves the same effect as that achieved by the solid-state imaging device according to the first exemplary embodiment.

A fifth exemplary embodiment will be described below with reference to the accompanying drawings, centering on differences from the first exemplary embodiment.

Figure 11:
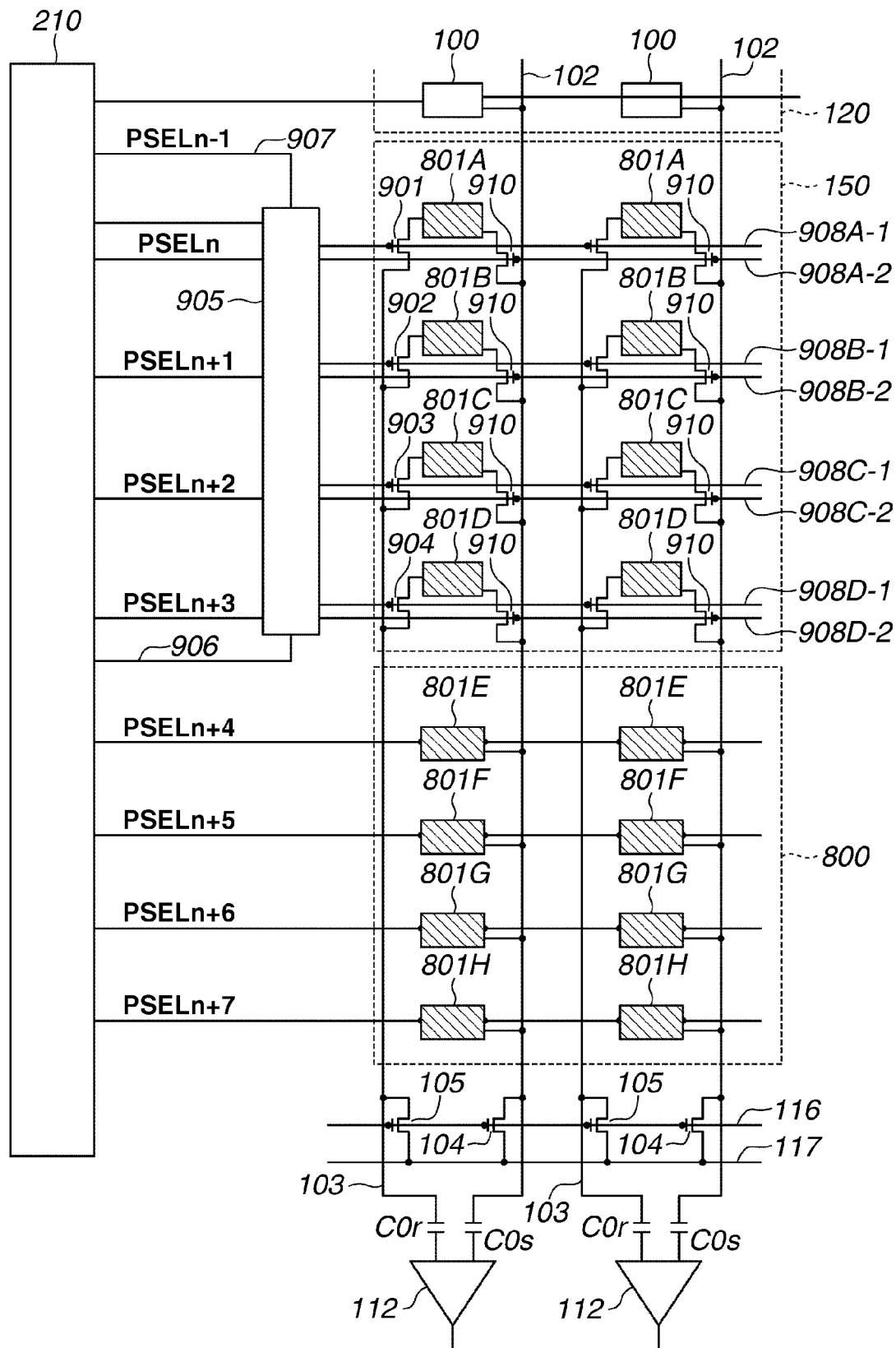
FIG. 11 is a block diagram illustrating a solid-state imaging device according to still another exemplary embodiment.

FIG. 11 is a block diagram illustrating a solid-state imaging device according to the present exemplary embodiment. An equivalent circuit of an effective pixel 100 is similar to the equivalent circuit according to the first exemplary embodiment (see FIG. 2). With the solid-state imaging device illustrated in FIG. 11, elements having the same functions as those illustrated in FIG. 1 are assigned the same reference numerals, and duplicate descriptions will be omitted.

With the solid-state imaging device illustrated in FIG. 11, eight optical black pixels 801A to 801H are arranged in each pixel column including the effective pixel 100. An optical black pixel 801 has a similar equivalent circuit to the effective pixel 100 with which light to the photo diode 201 is blocked. In the present exemplary embodiment, reference signal output pixels are the optical black pixels 801A to 801D.

In the present exemplary embodiment, some of the optical black pixels 801 (the optical black pixels 801A to 801D) are electrically connected to the first vertical signal line 102 and the second vertical signal line 103. The optical black pixels 801A to 801D are electrically connected to the first vertical signal line 102 via optical black (OB) signal selection switches 910, respectively. The optical black pixels 801A to 801D are also electrically connected to the second vertical signal line 103 via reference signal selection switches 901 to 904, respectively.

The reference signal selection switches 901 to 904 are electrically connected to the reference selection unit 905 via reference selection lines 908A-1, 908B-1, 908C-1, and 908D-1, respectively.

The OB signal selection switches 910 are electrically connected to the reference selection unit 905 via reference selection line 908A-2, 908B-2, 908C-2, and 908D-2, respectively. Accordingly, with the solid-state imaging device according to the present exemplary embodiment, some of the optical black pixels 801 (the optical black pixels 801A to 801D) may output a signal to the differential amplifier 112 via the first vertical signal line 102 and the second vertical signal line 103.

A signal output from the optical black pixels 801 to the differential amplifier 112 via the first vertical signal line 102 is referred to as an OB signal. A signal output from the optical black pixels 801 to the differential amplifier 112 via the second vertical signal line 103 is referred to as a reference signal.

The solid-state imaging device according to the present exemplary embodiment selects one optical black pixel 801 for outputting a reference signal from the optical black pixels 801A to 801D electrically connected to the second vertical signal line 103. The optical black pixels 801E to 801H (optical black pixels 801 other than ones for outputting a reference signal) each output an OB signal to the differential amplifier 112.

A pixel row having a defective optical black pixel 801 may be prevented from being used as an optical black pixel or as a reference signal output pixel.

In the present exemplary embodiment, since the optical black pixels 801A to 801D may also serve as a reference signal output pixel, the region for reference pixels may be saved. This effect is remarkable particularly when a number of reference pixels are arranged.

Four of the eight optical black pixels 801 illustrated in FIG. 11 each may be used also as a reference signal output pixel.

These four optical black pixels 801A to 801D are provided with the reference signal selection switches 901, 902, 903, and 904, respectively, and a method for selecting a pixel for outputting an OB signal (the OB signal selection switches 910 in the present exemplary embodiment).

The first vertical signal line 102 electrically connects the effective pixels 100 arranged in the pixel column direction with the optical black pixels 801. The second vertical signal line 103 electrically connects the optical black pixels 801A to 801D operating as a reference signal output pixel.

Controlling the reference signal selection switches 901, 902, 903, and 904 and the OB signal selection switches 910 establishes connection to the first vertical signal line 102 (when outputting an OB signal from the optical black pixels 801) or connection to the second vertical signal line 103 (when outputting a reference signal therefrom).

The present exemplary embodiment is characterized in having a method for selecting which of the first vertical signal line 102 and the second vertical signal line 103, to which outputs of the optical black pixels 801 (operating also as a reference signal output pixel) are to be connected.

An optical black pixel 801 selected as a reference signal output pixel is separated from the scanning by the vertical scanning circuit 210. In this case, the vertical scanning circuit 210 deselects this optical black pixel 801 for outputting a reference signal, and selects the following optical black pixel 801.

On the other hand, the reference selection unit 905 selects an optical black pixel 801 for outputting an OB signal based on the signal from the vertical scanning circuit 210. Referring to FIG. 11, for example, when the optical black pixel 801A in the first row is selected as a reference signal output pixel, the reference selection unit 905 establishes electrical conduction of the reference signal selection switch 901.

Then, based on pulses PSELn−1, PSELn+1, PSELn+2, and PSELn+3 from the vertical scanning circuit 210, the reference selection unit 905 sequentially establishes electrical conduction of the OB signal selection switches 910 electrically connected to the optical black pixels 801B, 801C, and 801D.

Subsequently, the vertical scanning circuit 210 sequentially scans PSELn+4 to PSELn+7. The operation of the optical black pixel 801A in the first row selected as a reference signal output pixel may be similar to that of the reference pixel 101 in the first exemplary embodiment.

Also in the present exemplary embodiment, at least one reference signal output pixel is selected from the optical black pixels 801A to 801D which are reference signal output pixels. Thus, the solid-state imaging device according to the present exemplary embodiment also achieves the same effect as that achieved by the solid-state imaging device according to the first exemplary embodiment.

Although, in the present exemplary embodiment, the optical black pixels 801 each include the photo diode 201, the reference pixels 101 described in the first exemplary embodiment may be used.

The present exemplary embodiment includes the optical black pixels 801E to 801H which output not a reference signal but an OB signal. The present exemplary embodiment is not limited to this configuration, and may include the optical black pixels 801 capable of outputting reference and OB signals to the differential amplifier 112.

For example, the present exemplary embodiment may not include the optical black pixels 801E to 801H. Even with this configuration, reference and OB signals may be suitably obtained by providing the optical black pixels 801 for outputting a reference signal and the optical black pixels 801 for outputting an OB signal.

Further, since the optical black pixels 801 for outputting an OB signal do not need to be provided, the chip area of the solid-state imaging device may be reduced.

Figure 12:
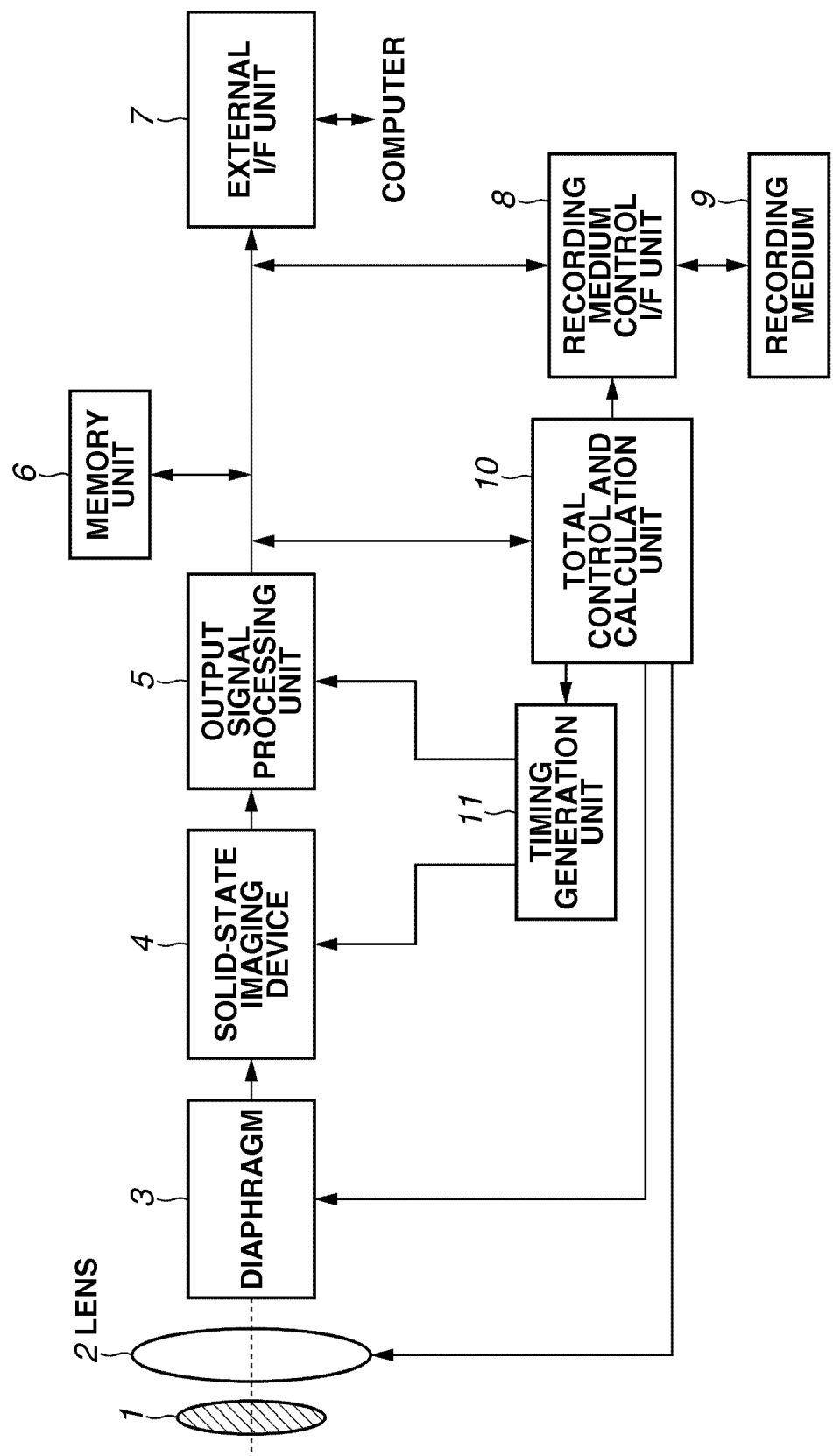
FIG. 12 is a block diagram illustrating a configuration of a solid-state imaging system.

A sixth exemplary embodiment in which the above-described solid-state imaging devices are applied to a solid-state imaging system will be described below. The solid-state imaging system may be, for example, a digital still camera, a digital camcorder, a monitoring camera, etc. FIG. 12 is a block diagram illustrating an example solid-state imaging system, i.e., a digital still camera to which a solid-state imaging device is applied.

Referring to FIG. 12, the digital still camera includes a barrier 1 for lens protection, a lens 2 for forming an optical image of a subject onto a solid-state imaging device 4, and a diaphragm 3 for varying the amount of light that has passed through the lens 2. The digital still camera further includes an output signal processing unit 5 for processing the signal output from the solid-state imaging device 4.

When the solid-state imaging device 4 outputs an analog signal, the output signal processing unit 5 includes an analog signal processing unit, an A/D converter, and a digital signal processing unit. The analog signal processing unit applies various correction processing to the analog signal from the solid-state imaging device 4 and then outputs the resultant signal to the A/D converter.

The A/D converter converts the signal from the analog signal processing unit into a digital form, and then outputs the resultant digital signal to the digital signal processing unit. The digital signal processing unit applies various correction processing and compression processing as required to the digital signal, and then outputs the resultant signal.

On the other hand, when the solid-state imaging device 4 outputs a digital signal as in the above-described fifth exemplary embodiment, the output signal processing unit 5 includes a digital signal processing unit which applies various correction processing and compression processing as required to the digital signal from the solid-state imaging device 4, and then outputs the resultant signal.

Referring to FIG. 12, the digital still camera further includes a memory unit 6 for temporarily storing image data, a recording medium control interface unit 8 for recording and reading data to/from a recording medium, and a detachable recording medium 9 such as a semiconductor memory for recording and reading captured data. The digital still camera further includes an external interface unit 7 for communicating with an external computer.

The digital still camera further includes a total control and calculation unit 10 for performing various calculations and controlling the entire digital still camera, and a timing generation unit 11 for outputting various timing signals to the solid-state imaging device 4 and the output signal processing unit 5. Timing signals may be input from an external device. The solid-state imaging system may include at least the solid-state imaging device 4 and the output signal processing unit 5 for processing the signal output from the solid-state imaging device 4.

As described above, the solid-state imaging system according to the present exemplary embodiment is capable of performing imaging operations by using the solid-state imaging device 4. Applying the solid-state imaging devices according to the above-described first to fifth exemplary embodiments to the solid-state imaging system enables imaging with little noise.

While the embodiment has been described with reference to exemplary embodiments, it is to be understood that the disclosure is not limited to the disclosed exemplary embodiments. The scope of the following claims is to be accorded the broadest interpretation so as to encompass all modifications, equivalent structures, and functions.

This application claims priority from Japanese Patent Applications No. 2011-107392 filed May 12, 2011 and No. 2012-026816 filed Feb. 10, 2012, which are hereby incorporated by reference herein in their entirety.

What is claimed is:

1. A solid-state imaging device comprising:
   a plurality of photoelectric conversion signal output pixels arranged in a plurality of rows and a plurality of columns, and each configured to output a photoelectric conversion signal based on a charge generated through photoelectric conversion of incident light;
   a plurality of reference signal output pixels arranged in corresponding one of the plurality of columns, and each configured to output a reference signal not based on incident light, the plurality of reference signal output pixels including a first reference signal output pixel and a second reference signal output pixel each arranged in a different row of the plurality of rows;
   a plurality of differential signal output units arranged in correspondence with the plurality of columns, and each configured to generate a difference by performing difference processing between the photoelectric conversion signal and the reference signal, and output an amplified differential signal by amplifying the difference; and
   a reference selection unit configured to cause either of the first reference signal output pixel and the second reference signal output pixel to be connectable to a corresponding one of the plurality of differential signal output units during a period of time when each of a plurality of photoelectric conversion signal output pixels arranged in a row outputs the photoelectric conversion signal to the corresponding one of the plurality of differential signal output units.

2. The solid-state imaging device according to claim 1, wherein there is provided a plurality of the reference selection units each corresponding to a different one of the plurality of pixel columns.

3. The solid-state imaging device according to claim 1, wherein there is provided a plurality of blocks each including the plurality of columns, and
   wherein the reference selection unit is provided in each block.

4. The solid-state imaging device according to claim 1, wherein each of the plurality of differential signal output units includes first and second terminals,
   wherein the photoelectric conversion signal output pixel is electrically connected to the first terminal of corresponding one of the plurality of differential signal output units,
   wherein the reference signal output pixels are electrically connected to the second terminal of corresponding one of the plurality of differential signal output units,
   wherein the solid-state imaging device includes an optical black pixel,
   wherein the optical black pixel is electrically connected to the first terminal, and
   wherein the reference signal output pixels are arranged between the optical black pixel and the photoelectric conversion signal output pixel.

5. The solid-state imaging device according to claim 1, wherein the reference signal output pixels are reference pixels for outputting a reference signal based on an applied voltage.

6. The solid-state imaging device according to claim 1, wherein the reference signal output pixels are optical black pixels.

7. The solid-state imaging device according to claim 6, wherein each of the plurality of differential signal output units includes first and second terminals,
   wherein the photoelectric conversion signal output pixel is electrically connected to the first terminal of the differential signal output unit, and
   wherein the reference selection unit electrically connects any of the optical black pixels to the first terminal of the differential signal output unit, and electrically connects the other optical black pixels to the second terminal of the differential signal output unit.

8. A solid-state imaging system comprising:
   the solid-state imaging device according to claim 1, and
   an output signal processing unit configured to process a signal output from the solid-state imaging device.

9. A method for driving a solid-state imaging device including a plurality of photoelectric conversion signal output pixels arranged in a plurality of rows and a plurality of columns, and each configured to output a photoelectric conversion signal based on a charge produced through photoelectric conversion of incident light, a plurality of reference signal output pixels arranged in corresponding one of the plurality of columns, and each configured to output a reference signal not based on incident light, the plurality of reference signal output pixels including a first reference signal output pixel and a second reference signal output pixel each arranged in a different row of the plurality of rows, and a plurality of differential signal output units arranged in correspondence with the plurality of columns, and each configured to generate a difference by performing difference processing between the photoelectric conversion signal and the reference signal, and output an amplified difference signal by amplifying the difference, the method comprising:
   selecting either of the first reference signal output pixel and the second reference signal output pixel during a period of time when each of a plurality of photoelectric conversion signal output pixels arranged in a row outputs the photoelectric conversion signal to the corresponding one of the plurality of differential signal output units.

10. The method for driving a solid-state imaging device according to claim 9,
    wherein the reference signal output pixels output a common reference signal to the differential signal output units.

11. The method for driving a solid-state imaging device according to claim 9, wherein the reference signal output pixels are optical black pixels,
    wherein each of the plurality of differential signal output units includes first and second terminals,
    wherein the photoelectric conversion signal output pixel is electrically connected to the first terminal of the differential signal output unit,
    wherein at least one optical black pixel for outputting a reference signal to the first terminal of corresponding one of the plurality of differential signal output units and at least one optical black pixel for outputting a reference signal to the second terminal of corresponding one of the plurality of differential signal output units is selected from the optical black pixels.

* * * * *